United States Patent
Ok et al.

(10) Patent No.: US 11,957,069 B2
(45) Date of Patent: Apr. 9, 2024

(54) CONTACT RESISTANCE OF A METAL LINER IN A PHASE CHANGE MEMORY CELL

(71) Applicant: International Business Machines Corporation, Armonk, NY (US)

(72) Inventors: Injo Ok, Loudonville, NY (US); Oleg Gluschenkov, Tannersville, NY (US); Alexander Reznicek, Troy, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 17/451,861

(22) Filed: Oct. 22, 2021

(65) Prior Publication Data

US 2023/0129619 A1    Apr. 27, 2023

(51) Int. Cl.
*G11C 11/00*    (2006.01)
*H10B 63/00*    (2023.01)
(Continued)

(52) U.S. Cl.
CPC ........... *H10N 70/235* (2023.02); *H10B 63/30* (2023.02); *H10N 70/023* (2023.02);
(Continued)

(58) Field of Classification Search
CPC .. H10N 70/235; H10N 70/066; H10N 70/883; H10N 70/026; H10N 70/8845;
(Continued)

(56) References Cited

U.S. PATENT DOCUMENTS

| 7,324,365 B2 | 1/2008 | Gruening-von Schwerin |
| 7,943,502 B2 | 5/2011 | Park |

(Continued)

FOREIGN PATENT DOCUMENTS

| CN | 109427972 A | * 3/2019 | ............ H01L 27/24 |
| WO | 2015069468 A1 | 5/2015 | |
| WO | 20150694681 W | 5/2015 | |

OTHER PUBLICATIONS

Okabe et al., "Understanding the Switching Mechanism of Interfacial Phase Change Memory", Journal of Applied Physics, 125, 184501 (2019), Published Online: May 13, 2019, 15 Pgs. <https://doi:10.1063/1.5093907>.

(Continued)

*Primary Examiner* — Viet Q Nguyen
(74) *Attorney, Agent, or Firm* — Edward J. Wixted, III

(57) ABSTRACT

An approach to provide a semiconductor structure for a phase change memory cell with a first liner material surrounding a sidewall of a hole in a dielectric material where the hole in the dielectric is on a bottom electrode in the dielectric material. The semiconductor structure includes a layer of a second liner material on the first liner material, where the second liner material has an improved contact resistance to a phase change material. The semiconductor structure includes the phase change material abutting the layer of the second liner material on the first liner material. The phase change material fills the hole in the dielectric material. The second liner material that is between the phase change material and the first liner material provides a lower contact resistivity with the phase change material in the crystalline phase than the first liner material.

18 Claims, 10 Drawing Sheets

(51) Int. Cl.
*H10N 70/00* (2023.01)
*H10N 70/20* (2023.01)

(52) U.S. Cl.
CPC ......... *H10N 70/026* (2023.02); *H10N 70/063* (2023.02); *H10N 70/066* (2023.02); *H10N 70/068* (2023.02); *H10N 70/841* (2023.02); *H10N 70/883* (2023.02); *H10N 70/8845* (2023.02)

(58) Field of Classification Search
CPC .. H10N 70/841; H10N 70/063; H10N 70/023; H10N 70/068; H10B 63/30
USPC ........................................................ 365/163
See application file for complete search history.

(56) References Cited

U.S. PATENT DOCUMENTS

| | | | |
|---|---|---|---|
| 8,030,635 B2 | 10/2011 | Lung | |
| 8,471,236 B2 | 6/2013 | Breitwisch | |
| 8,729,521 B2 | 5/2014 | Lung | |
| 9,064,957 B2 * | 6/2015 | Hwang | H01L 29/66666 |
| 9,111,609 B2 | 8/2015 | Happ | |
| 9,135,992 B2 | 9/2015 | Meade | |
| 9,293,199 B2 | 3/2016 | Krebs | |
| 9,577,052 B2 * | 2/2017 | Oh | H01L 21/76224 |
| 9,634,109 B2 * | 4/2017 | Oh | H01L 29/7827 |
| 9,818,843 B2 * | 11/2017 | Oh | H10B 12/482 |
| 10,319,440 B1 * | 6/2019 | Kim | H10N 70/231 |
| 10,825,514 B2 * | 11/2020 | Kim | H10N 70/841 |
| 10,892,413 B2 * | 1/2021 | Bruce | H10N 70/066 |
| 10,903,422 B2 * | 1/2021 | Leobandung | H10N 70/063 |
| 11,038,107 B2 * | 6/2021 | Collins | H10N 70/826 |
| 11,437,571 B2 * | 9/2022 | Kim | H10N 70/841 |
| 11,456,415 B2 * | 9/2022 | Ok | H10N 70/826 |
| 11,545,624 B2 * | 1/2023 | Cheng | H10N 70/826 |
| 11,588,105 B2 * | 2/2023 | Adusumilli | H10N 70/841 |
| 11,621,394 B2 * | 4/2023 | Brew | G11C 11/54 365/163 |
| 2007/0012956 A1 | 1/2007 | Gutsche | |
| 2012/0292588 A1 * | 11/2012 | Fujii | H10N 70/826 257/E47.001 |
| 2017/0069726 A1 | 3/2017 | Kye | |
| 2019/0214560 A1 | 7/2019 | Brightsky | |
| 2020/0411754 A1 | 12/2020 | Ruiz | |
| 2022/0102626 A1 * | 3/2022 | Li | H10N 70/826 |
| 2023/0098562 A1 * | 3/2023 | Brew | H10N 70/826 257/4 |

OTHER PUBLICATIONS

International Searching Authority, "Notification of Transmittal of the International Search Report and the Written Opinion of the International Searching Authority, or the Declaration", International application No. PCT/EP2022/077416, International Filing Date Sep. 30, 2022, dated Mar. 31, 2023, 17 pages.

* cited by examiner

CONTACT RESISTANCE OF A METAL LINER IN A PHASE CHANGE MEMORY CELL

BACKGROUND OF THE INVENTION

The present invention relates generally to the field of semiconductor technology and more particularly to providing a low resistance contact between a phase change material and a metal electrode by depositing an additional element or implanting one or more elements into the cell liner of a change material cell.

Phase change materials include various chalcogenide glass materials that can be used in semiconductor device applications, such as phase change random access memory (PCRAM), which may also be known as PRAM, PCM, or PCME devices. A phase change material in a PCRAM typically has at least two solid phases, a crystalline phase and an amorphous phase. The transformation between these two phases can be achieved by changing the temperature of the phase change material. Typically, the transformation of the phase change material can be induced by heating through optical pulses or electrical or Joule heating.

The optical and electronic properties can vary significantly between the amorphous and crystalline phases of the phase change material. In typical memory applications, switching from the high-resistance or "reset" state, where part or all of the phase change material is amorphous, occurs when a current pulse is applied that heats the amorphous material above the crystallization temperature for a sufficiently long time for the material to crystallize. The switch occurs because the threshold switching effect leads to a drastic and sudden (within nanoseconds) reduction of the resistance of the amorphous phase when a certain threshold field is surpassed, at a given threshold voltage. Switching from the low-resistance or "set" state, where the phase change material is crystalline, is achieved by a high current pulse with a very short trailing edge. In typical PCM semiconductor applications, the current pulse heats the material by Joule heating, melts it, and enables very fast cooling (melt-quenching) such that the phase change material solidifies in the amorphous state. Since a phase change material permits reversible phase transformation in a typical case of a PCRAM device, the memory bit status can be distinguished by determining the state of phase change material in the memory bit.

PCRAM devices can be employed in Neuromorphic Resistive Processing (RPU) units wherein the resistance of individual PCRAM devices is continuously varied by continuously changing the relative amounts of amorphous and crystalline phases of the phase change material. An array of such resistive storage elements or cells stores analog weights or coefficients. These analog weights can be incrementally changed or updated by voltage or current pulses resulting in an incremental increase of crystalline phase within an individual PCRAM device and a corresponding incremental decrease of its resistance. This provides an analog memory array with in-memory compute function and greatly improves the efficiency of machine learning algorithms. Because resistive storage elements in an RPU store analog weights, the incremental resistance shifts shall be less than 0.1% of the programmable resistance range and shall be stable over time.

SUMMARY

Embodiments of the present invention provide a phase change memory cell with a first liner material surrounding a sidewall of a hole in a dielectric material that is on a bottom electrode in the dielectric material and a layer of a second liner material on the first liner material, where the second liner material has an improved contact resistivity to a phase change material. The embodiments of the present invention include the phase change material abutting the layer of the second liner material on the first liner material, wherein the phase change material fills the hole in the dielectric material. Embodiments of the present invention provide a phase change memory cell where the second liner is between the phase change material and the first liner material.

Embodiments of the present invention provide a method of forming an opening in a dielectric material above a bottom electrode and depositing a first liner material for a phase change memory cell over exposed surfaces of the dielectric material. The method includes depositing a first liner material for a phase change memory cell over exposed surfaces of the dielectric material and depositing a second liner material over the first liner material. The method includes depositing a phase change material over the second liner material and forming a top electrode over the phase change material. The method includes performing an annealing process that transforms at least a portion of the second liner material into one of a metal germanosilicide material, a metal germanide material, or a metal silicide material.

BRIEF DESCRIPTION OF THE DRAWINGS

The above and other aspects, features, and advantages of various embodiments of the present invention will be more apparent from the following descriptions taken in conjunction with the accompanying drawings.

DETAILED DESCRIPTION

Figure 1:
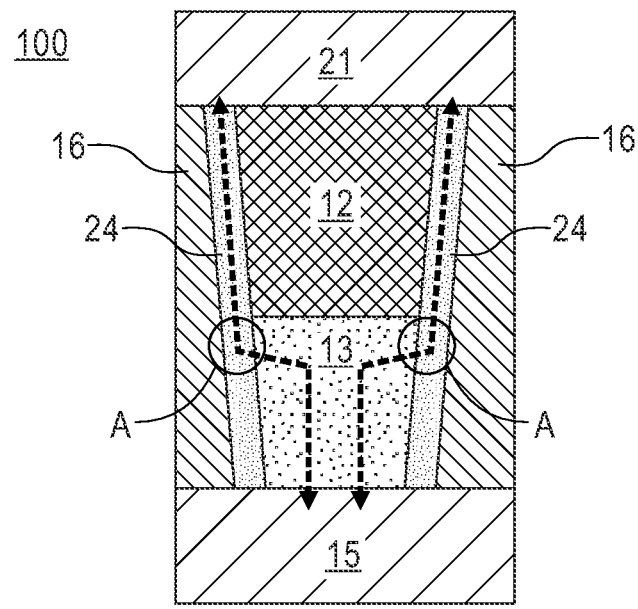
FIG. 1 depicts a cross-sectional view of semiconductor structure 100 depicting an electrical current flow in a PCM device with a portion of a GST material in crystalline phase and a portion of the GST material in an amorphous state, in accordance with an embodiment of the present invention.

Embodiments of the present invention recognize that phase change memory (PCM) devices operate based on changes in electrical resistance that occur in a phase change material during an induced material phase change from an amorphous atomic structure to a crystalline atomic structure or from a crystalline atomic structure to an amorphous atomic structure. Embodiments of the present invention recognize that when a phase change material, such as germanium (Ge)—selenium (Se)-tellurium (Te) ternary alloys or Ge-antimony (Sb)—Te ternary alloys, both of which may be known as GST, are in an amorphous state, the phase change material has a high resistance and electrical current in a PCM device will flow through the liner surrounding the phase change material from one metal electrode to the other metal electrode. This is due to the fact that the resistance of adjacent metallic liner is selected to be lower than that of the amorphous phase change material. The use of electrically coupled conductive liners in parallel with the PCM material greatly improves the linearity and stability of PCRAM incremental resistance changes that are vital for using them in Neuromorphic Resistive Processing units and multi-bit digital memories.

Embodiments of the present invention recognize that a portion of the phase change material may change to the lower resistivity crystalline phase and in this case, the electric current may go through the portion of the phase change material that is in the low resistance crystalline phase while avoiding the high resistance portion of the phase change material in the amorphous state by flowing through the material lining the phase change material in the PCM cell. Embodiments of the present invention recognize that the interfaces between different conductive materials create free carrier scattering and introduce a resistance to the electrical current flow. The interfacial resistance is often referred to as the contact resistance. The interfacial or contact resistance is inversely proportional to the contact area. In order to assess the interfacial free carrier scattering independent of the contact geometry, the contact resistivity is used for a pair of adjacent conductive materials. Typical electrical contact resistivities of various types of material used in semiconductor devices can be generalized as a typical contact resistivity for metal-to-metal interfaces that can range from $10^{-11}$ to $10^{-12}$ Ohm-cm$^2$ and a typical contact resistivity between different metallic compounds can range between $10^{-10}$ to $10^{-11}$ Ohm-cm$^2$. A contact resistivity between a metallic compound and a semiconductor can typically range from $10^{-7}$ to $10^{-9}$ Ohm-cm$^2$. Embodiments of the present invention recognize that the observed contact resistivity of GST to a metallic compound, such as a conventional TaN or TiN liner material is approximately $10^{-5}$ Ohms-cm$^2$. Such high contact resistivity forces the electrical current to flow almost entirely through the conductive liner material without crossing into the adjacent crystalline GST material. Consequently, the resistance of such PCM device with conductive liners is weakly modulated by the presence or absence of crystalline phase of the phase change material. Accordingly, there is a need to reduce the contact resistance between GST and conventional metal compound used as a liner in a PCM device.

Embodiments of the present invention recognize that the contact resistance between the metal compound liner material and the phase change material degrades the PCM device performance and providing new materials and/or processes to reduce the contact resistance between GST and the metal compound material that surrounds the side of the GST in a PCM device would be advantageous.

Additionally, embodiments of the present invention recognize that a PCM device typically is fabricated during the back end of the line (BEOL) semiconductor manufacturing processes while transistors that may be present in the substrate are fabricated during the front end of line (FEOL) manufacturing processes. As known to one skilled in the art, temperature sensitive elements of state-of-the-art complementary metal oxide semiconductor (CMOS) logic circuits typically have a thermal budget for heat exposures to the gate stack and active dopant structures that is limited to annealing exposures at about 450° C. for minutes, at about 500° C. for seconds, and at about 950° C. for hundreds of microseconds. Exceeding these thermal budgets thickens the gate dielectric, shifts transistor threshold voltages, and deactivates dopants. Accordingly, the maximum thermal budget of BEOL processing should not exceed 400° C. for conventional anneals and 1000° C. for ultra-short scale anneals that are less than hundreds of microseconds. Embodiments of the present invention recognize that the materials and processes to form interfaces between GST and an improved metal compound that lines the GST in the PCM device should adhere to the FEOL transistor and BEOL interconnect structure at BEOL-compatible thermal budget.

Embodiments of the present invention provide a PCM device with improved contact resistance and resistivity between the phase change material in the crystalline phase and the liner material by forming a layer of a metal germanosilicide, a metal germanide, or a metal silicide between the phase change material, such as GST and the liner. The layer of the metal germanosilicide, the layer of a metal germanide material, or the layer of the metal silicide has a lower contact resistance and resistivity with GST than the contact resistance and resistivity of the liner material (e.g., TaN or TiN) with GST. Embodiments of the present invention also provide a compound material, such as TiGe2:As or TiSi2:As between the liner and the GST that also has a lower contact resistance and resistivity than the contact resistance and resistivity of GST with the liner. At the same time, the metal germanosilicide, the metal germanide, or the metal silicide has even lower contact resistance and resistivity with the liner material than the contact resistance and resistivity of the metal germanosilicide, metal germanide, or the metal silicide with the GST.

Embodiments of the present invention provide another PCM device with improved contact resistance and resistivity between the phase change material in the crystalline phase and the liner material. Embodiments of the present invention include providing a PCM device with a layer of one of a metal germanosilicide, metal germanide, or a metal silicide between the phase change material, such as GST and the liner.

Embodiments of the present invention provide a method of forming a semiconductor structure for a PCM device with an improved liner material that contacts the phase change material. When the method is completed, the improved liner material is between the phase change material (e.g., GST) and the conventional liner material. The phase change material may be a doped phase change material, or a multilayered phase change material composed of alternating layer of doped and undoped phase change material. Embodiments of the present invention provide a method of forming the improved liner material that is composed of a metal germanosilicide, a metal germanide or a metal silicide.

Embodiments of the present invention include a method of etching a hole or pore in a layer of a dielectric material, such as tetraethoxysilane (TEOS). The hole is over a bottom electrode. One or more layers of a hardmask material or other sacrificial material used for patterning the hole reside over the dielectric layer.

Embodiments of the present invention depositing a liner enhancement material after forming the hole on the bottom electrode, after removing the remaining hardmask material, and after depositing a conventional liner (e.g., TiN, TaN, etc.) over the bottom electrode and in the hole. The method includes depositing a layer of an enhancement material, such as one of titanium, germanium, cobalt, or nickel over the conventional liner material.

Furthermore, embodiments of the present invention provide two optional steps performed after depositing the enhancement material and before depositing the phase change material. The two optional steps may be performed independently or sequentially. The optional steps include depositing or implanting a Group IV material and/or depositing or implanting one or more of arsenic (As), phosphorous (P), boron (B), or antimony (Sb) over or into the enhancement material. A Group IV material is a material or a semiconductor material in the Periodic Table of Elements developed by D. Mendeleev.

Embodiments of the present invention in depositing a layer of a phase change material, such as GST over the enhancement material, which may include one or more of the implanted or deposited doping materials from the optional steps. The method includes performing a planarization of the phase change material and forming a top electrode over the remaining phase change material above the bottom electrode.

Embodiments of the present invention include performing an annealing process to transform the enhancement material in contact with the phase change material (e.g., GST) into one of a metal germanosilicide, a metal germanide or a metal silicide. The annealing process can be a rapid anneal that does not exceed the thermal budget of the semiconductor device already present on the substrate.

Embodiments of the present invention also provide a method of forming an improved liner material abutting a phase change material (e.g., GST, a doped GST, or a multilayer phase change material) in a second PCM device using a mushroom-type structure in the phase change material during phase change transitions. Embodiments of the present invention provide one or more heater elements embedded in a dielectric material. Embodiments of the present invention also provide a method that includes depositing a layer of the enhancement material (e.g., titanium, cobalt, or nickel) over two heater elements in a layer of a cap material. The method includes depositing a layer of the enhancement material (e.g., titanium, cobalt, or nickel) over two heater elements in a layer of a dielectric material (e.g., a nitride or an oxide dielectric material). The heater elements are formed with conventional semiconductor heater formation processes in a selectively etched opening or hole in the dielectric layer that is directly over a portion of a metal layer. The heater elements include one or more deposited layers of heater materials, such as titanium nitride or tantalum nitride. Each of the two heater elements are formed on a portion of a metal layer in a back end of the line or the middle of the line metal layer of the semiconductor structure.

Embodiments of the present invention include depositing a layer of an enhancement material, such as one of titanium, germanium, cobalt, or nickel over the top surface of the dielectric material and the heater elements. The enhancement material reacts with the phase change material during a quick, high temperature anneal performed in later steps to form a new liner material contacting the phase change material. The improved liner material composed of a metal germanosilicide, a metal germanide, or a metal silicide material provides improved electrical properties, such as a lower contact resistance and resistivity with the phase change material.

Additionally, embodiments of the present invention provide a method that may include one or more of the two optional steps discussed above (e.g., depositing or implanting a Group IV semiconductor material or one of As, P, B, or Sb) that may be performed after depositing the enhancement material.

The method further includes depositing a phase change material over the enhancement material. The depositing of the phase change material includes depositing one or more of a doped phase change material or an undoped phase change material. In some embodiments, multiple alternating layers of undoped and doped phase change materials may be deposited over the dielectric material and the heater elements.

Embodiments of the present invention include depositing a second layer of the enhancement material over the phase change material. One or two of the two optional steps may be performed on the top surface of the phase change material before depositing the second layer of the enhancement material (e.g., using one of ALD, MLD, PVD, or CVD). As previously discussed, in one optional deposition process or an ion implantation process, a thin layer of an additional material, such as one of germanium (Ge), titanium (Ti), cobalt (Co), silicon (Si) or another Group IV material from the Periodic Table of Elements can be deposited or implanted into enhancement layer 42. In the second option step, one of As, P, B, or Sb is deposited or implanted into the top of the phase change material before depositing the enhancement material.

Embodiments of the present invention include depositing a top electrode material and a cap material over the second layer of the enhancement material. Embodiments of the present invention include patterning the top surface of the cap material and etching the cap material, the top electrode, the second and the first layer of the enhancement material, and the phase change material to form a bridge-like PCM device.

Embodiments of the present invention include performing an annealing process to transform both the first layer of the enhancement material contacting the phase change material and the second layer of the enhancement material on the phase change material into the improved liner material (e.g., a metal germanosilicide, a metal germanide, or a metal silicide). The improved liner provides a lower contact resistance and resistivity with the phase change material in the crystalline phase than a conventional liner material.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for advanced semiconductor devices, and only so much of the commonly practiced process steps are included as are necessary for an understanding of the described embodiments. The figures represent cross-section portions of a portion of an advanced semiconductor device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment," "an embodiment," etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper," "lower," "right," "left," "vertical," "horizontal," "top", "bottom," and derivatives thereof shall relate to the disclosed structures and methods, as oriented in the drawing figures. The terms "overlying," "atop," "over," "on "positioned on," or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 depicts a cross-sectional view of semiconductor structure 100 depicting an electrical current flow in a PCM device with a portion of a phase change material, such as GST in crystalline phase GST labelled as c-GST 13 and a portion of the GST material in an amorphous state GST labelled as a-GST 12, in accordance with an embodiment of the present invention. As depicted, FIG. 1 includes bottom electrode 15, c-GST 13, a-GST 12, liner 24, top electrode 21, bottom electrode 15, and ILD 16. In various embodiments, GST is a phase change material composed of germanium, selenium, and tellurium. In an embodiment, GST is a phase change material composed of germanium, antimony, and tellurium. In other embodiments, GST, c-GST 13, or a-GST 12 is a phase change material doped with a group IV element in the Periodic Table of Elements, such as germanium, silicon, or tin. Semiconductor structure 100 depicts a PCM device with a partially transitioned phase material composed of a portion of c-GST 13 adjacent to bottom electrode 15 and a-GST 12 adjacent to top electrode 21. The PCM device depicted in FIG. 1 can be known as a PCM device.

Also, depicted as the dashed line in FIG. 1 is the electrical current path between bottom electrode 15 and top electrode 21. As previously discussed, the electrical resistivity of the amorphous phase of a phase change material is very high while the electrical resistivity of the crystalline phase of the phase change material is much lower. In a typical PCM device, liner 24 can be composed of a layer of titanium nitride (TiN), tantalum nitride (TaN), silicon (Si), germanium (Ge), amorphous carbon, tantalum (Ta), titanium (Ti) or a metal nitride but is not limited to these liner materials. Liner 24 has an electrical resistance that is lower than a-GST 12 but higher than c-GST 13. Therefore, as depicted in FIG. 1, in phase change material, such as GST that has undergone a partial phase transition from an amorphous phase or state depicted as a-GST 12 to a crystalline phase depicted as c-GST 13, the path of the electrical current runs through liner 24 with a lower resistance than a-GST 12 in the portion of the PCM device with the amorphous state phase change material and passes through liner 24 in the areas identified as "area A" in FIG. 1 and, then passes through c-GST 13 with a lower resistance than liner 24, if the interfacial or contact resistance between c-GST 13 and liner 24 is substantially low.

As previously discussed, one of the challenges or opportunity to improve the performance of a PCM device depicted in FIG. 1 is an ability to provide a structure and/or materials in liner 24 that create a lower interface electrical resistivity between liner 24 and c-GST 13. The typical resistivity of the interface between c-GST 13 and liner 24 is quite high (e.g., in the range of from $10^{-4}$ to $10^{-5}$ Ohm-cm$^2$). In order to improve the electrical performance of the PCM device depicted in FIG. 1 in the area of liner 24 identified as area A where the path of the current transitions from liner 24 to c-GST 13, new materials or processes creating a new interface contacting c-GST 13 is desired and will be disclosed in embodiments of the present invention. The new interface materials for liner 24 and the processes to alter the composition and properties of liner 24 to provide a lower interface resistivity in area A between the new improved liner interface (not depicted in FIG. 1) and c-GST 13. In various embodiments of the present invention disclosed hereinafter disclose a new liner interface with c-GST 13 materials to improve and reduce the electrical interface resistance and resistivity between the liner and c-GST 13 in the region depicted as area A in FIG. 1.

Semiconductor structure 100 for a typical PCM device with a partially transitioned phase change material can include top electrode 21 and bottom electrode 15 composed of typical electrode materials, such as TaN, TiN, Ru, or W along with a-GST 12 and c-GST 13 which as previously stated are amorphous and crystalline phases, respectively of a Ge—Sb—Te alloy that surrounds the sidewalls of the GST phase change material by liner 24 composed of but not limited to TiN or TaN.

Figure 2:
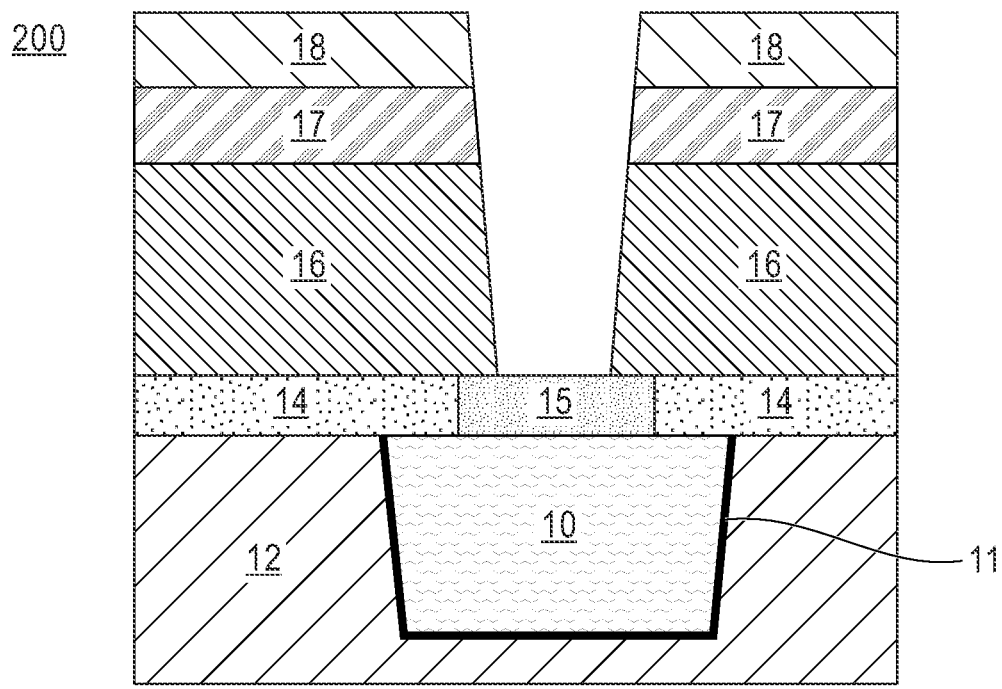
FIG. 2 is a cross-sectional view of the semiconductor structure after removing a portion of interlayer dielectric (ILD) 16, sacrificial mask 17, and hardmask 18 to form an opening above bottom electrode 15, in accordance with an embodiment of the present invention.

FIG. 2 is a cross-sectional view of semiconductor structure 200 after removing a portion of ILD 16, sacrificial mask 17, and hardmask 18 to form an opening in ILD 16 above bottom electrode 15, in accordance with an embodiment of the present invention. As depicted, FIG. 2 includes ILD 12 and Mx metal 10 under cap 14 and bottom electrode (BE) 15, ILD 16 over cap 14 and a portion of BE 15, sacrificial mask 17 over ILD 16, and hardmask 18 covering sacrificial mask 17. Semiconductor structure 200 is depicted after patterning hardmask 18 and selectively etching ILD 16, sacrificial mask 17, and hardmask 18 selective etch for example, using a reactive ion etch (RIE) to remove a portion of hardmask 18, sacrificial mask 17, and ILD 16 over BE 15.

For example, a circular portion of hardmask 18, sacrificial mask 17, and ILD 16 can be removed forming a pore or a round hole which may have a slightly larger top diameter than a bottom diameter of the hole.

In various embodiments, Mx metal 10 is a portion of any metal layer formed in a back end of the line (BEOL) semiconductor manufacturing process. In an embodiment, Mx metal 10 is a portion of a metal layer that is formed in a middle of the line (MOL) semiconductor manufacturing process. For example, Mx metal 10 may be composed of copper (Cu), tungsten (W), ruthenium (Ru), cobalt (Co), or any other metal material or alloy that can be used in a MOL or BEOL metal layer. Mx metal 10 may be connected to one or more lines in the BEOL metal layers (not depicted) or to one or more semiconductor devices (not depicted) formed below or in the Mx metal layer. Contact liner 11 can surround the sides and bottom of Mx metal 10. Contact liner 11 may be composed of known contact or landing pad liner material, such as but not limited to TiN or TaN. The width of the top surface of Mx metal 10 can range from 36 to 60 nm but is not limited to this range of widths. ILD 12 surrounds contact liner 11 and may be composed of any dielectric material, such as silicon dioxide ($SiO_2$) used as an interlayer dielectric material. As known to one skilled in the art, the bottom of Mx metal 10 may be connected by vias or direct contact with one or more semiconductor or logic devices (not depicted in FIG. 2) below Mx metal 10.

Cap 14, as depicted, is over ILD 12, portions of Mx metal 10, and surrounds the sides of BE 15. Cap 14 can be a layer of a dielectric material, such as SiN, another nitride, an oxide, or other similar dielectric cap material used in PCM device formation. In some cases, cap 14 is a porous dielectric cap material. A typical thickness of cap 14 for a PCM device can be 25 to 40 nm but is not limited to this thickness.

In various embodiments, BE 15 is the bottom electrode of the PCM device. BE 15 may be composed of a typical electrode material such as TaN, TiN, Ru, or W but is not limited to these materials. A typical thickness of BE 15 can be 30 to 40 nm but is not limited to this range of thicknesses. BE 15 may be a width that is less than the width of the top surface of Mx metal 10 although in some cases, the width of BE 15 may be the same as or greater than the width of the top surface of Mx metal 10. Cap 14 abuts the vertical sides of BE 15, as depicted in FIG. 2.

ILD 16 is over cap 14 and portions of the top surface of BE 15. In various embodiments, ILD 16 is composed of tetraethoxysilane (TEOS). The thickness of the layer of ILD 16 can range from 80 to 140 nm but is not limited to these thicknesses. In various embodiments, the thickness of ILD 16 determines, at least in part, the depth of the hole in which the phase change material or GST is deposited in later process steps. ILD 16 is not limited to TEOS in other embodiments and may be composed of a different low-k dielectric material or another dielectric material, such as $SiO_2$, etc.

Sacrificial mask 17 resides over ILD 16 and may be composed of silicon nitride (SiN) or another suitable dielectric material. Hardmask 18 resides over sacrificial mask 17 and may be composed of TiN or another suitable hardmask material. The thickness of sacrificial mask 17 and hardmask 18 can each be approximately 25 nm but, are not limited this thickness.

A portion of the top surface of hardmask 18 is patterned using lithography and subsequently, a portion of hardmask 18, sacrificial mask 17, and ILD 16 are etched, for example using RIE. A round portion of hardmask 18, sacrificial mask 17, and ILD 16 removed and leaves an unfilled pore or tube in ILD 16 over a center portion of BE 15. The bottom diameter of the unfilled pore can range from 10 nm to 80 nm but is not limited to these diameters.

Figure 3:
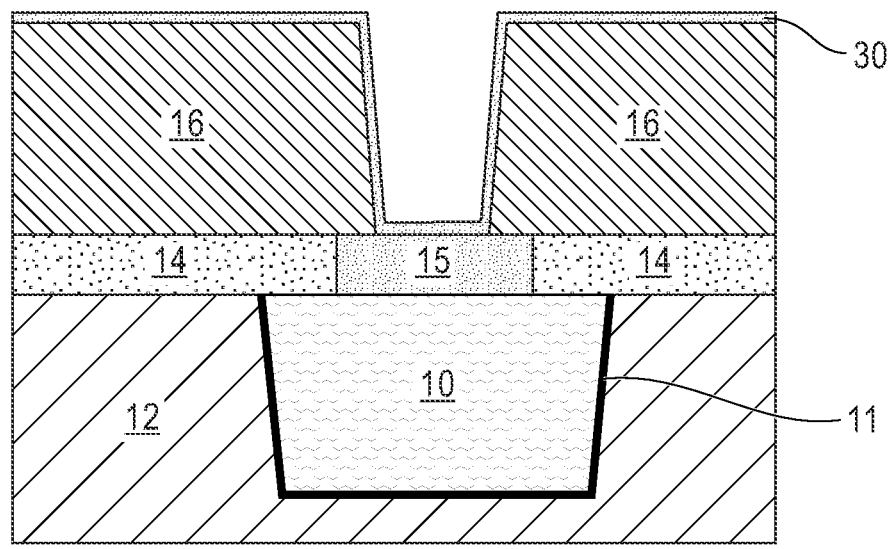
FIG. 3 is a cross-sectional view of the semiconductor structure after performing a chemical mechanical polish and depositing a liner material, in accordance with an embodiment of the present invention.

FIG. 3 is a cross-sectional view of semiconductor structure 300 after performing a chemical mechanical polish (CMP) and depositing liner 30, in accordance with an embodiment of the present invention. As depicted, FIG. 3 includes liner 30, BE 15, ILD 16, cap 14, Mx metal 10 with contact liner 11 in ILD 12. After selectively etching the portions of ILD 16, sacrificial mask 17, and hardmask 18 to form semiconductor structure 200, a chemical mechanical polish (CMP) removes hardmask 18, sacrificial mask 17, and in some cases, a small top portion of ILD 16. In various embodiments, as depicted in FIG. 3, liner 30 is deposited over exposed surfaces of ILD 16 and BE 15.

In various embodiments, liner 30 is composed of tantalum nitride (TaN). In other embodiments, liner 30 is composed of titanium nitride (TiN) or tungsten (W). However, liner 30 is not limited to these materials and may be another liner material suitable for a PCM device liner around a phase change material (e.g., amorphous carbon, Ge, Ti, Si, Ta, TaN, or other metal nitride liner material). Liner 30 can be deposited using one of atomic layer deposition (ALD), chemical vapor deposition (CVD, physical vapor deposition (PVD), variations of these deposition processes, such as plasma enhanced CVD but is not limited to these deposition processes. The thickness of liner 30 can range from 0.1 nm to 20 nm but, is not limited to these thicknesses. In one embodiment, liner 30 is not deposited and enhancement layer 42 is deposited on ILD 16 and BE 15.

Figure 4:
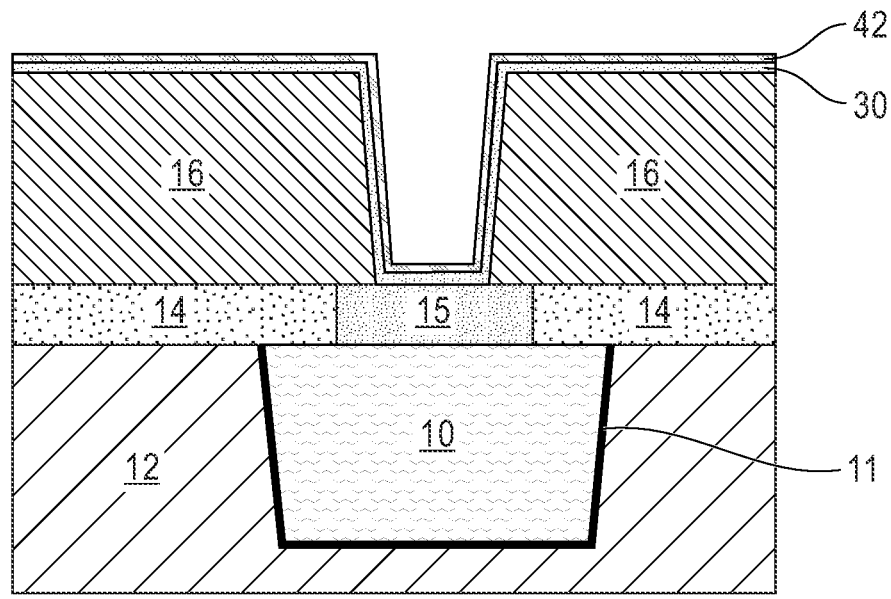
FIG. 4 is a cross-sectional view of the semiconductor structure after depositing an enhancement layer over the liner material, in accordance with an embodiment of the present invention.

FIG. 4 is a cross-sectional view of semiconductor structure 400 after depositing enhancement layer 42 over liner 30, in accordance with an embodiment of the present invention. As depicted, FIG. 4 includes enhancement layer 42, liner 30, ILD 16, BE 15, cap 14, Mx metal 10 with contact liner 11, and ILD 12. Enhancement layer 42 is a metal that can be heat treated or annealed in later processes discussed in detail with respect to FIG. 8 to combine with liner 30 and some elements of GST (e.g., the phase change material not depicted in FIG. 4) to improve the interface contact resistance of the resulting metal compound liner (e.g., a metal germanosilicide disclosed hereinafter).

In various embodiments, enhancement layer 42 is a thin layer of a metal material, such as Ti or/and germanium (Ge) that is deposited over the surface of liner 30. The thickness of enhancement layer 42 in the range of 0.1 nm to 10 nm or, equivalently, from less than one full atomic monolayer to about 50 atomic monolayers but, is not limited to this range. In some embodiments, enhancement layer 42 is cobalt or nickel. Enhancement layer 42 may be deposited using one of atomic layer deposition (ALD), chemical vapor deposition (CVD), plasma-enhanced CVD, or physical vapor deposition (PVD) but is not limited to these deposition processes. The material or materials for enhancement layer 42 can be selected for their ability to initiate an interface reaction with GST and/or liner 30 during a later annealing process, for example, to form a metal germanosilicide or a metal silicide in later processes. The material selected and deposited for enhancement layer 42 can react with GST and/or liner 30 during a subsequent annealing process. In one embodiment, a layer of a conventional liner material, such as TaN, TiN, etc. used in liner 30 (e.g., discussed with reference to FIG. 3) is deposited over exposed surfaces of ILD 16 and BE 15. In this embodiment, the deposition of the conventional liner material can occur by one of ALD PVD, or CVD and may or may not be followed an annealing process prior to depositing enhancement layer 42 on the conventional liner material.

In some embodiments, in one of an optional deposition process (e.g., ALD, PVD, or CVD) or an ion implantation process, a thin layer of an additional material, such as one of germanium (Ge), titanium (Ti), cobalt (Co), silicon (Si) or another Group IV material from the Periodic Table of Elements can be deposited or implanted into enhancement layer 42. An implantation process, such as ion implantation may be used to implant one or more of these materials as a dopant into enhancement layer 42.

As known to one skilled in the art, ion implantation is a doping technique where the dopant species are first ionized and then accelerated toward the substrate such that they impinge onto the substrate with certain energy. Upon colliding with the substrate, the ions are neutralized, and the resultant dopant atoms decelerate within the substrate in collisions with substrate material, in this case, enhancement layer 42. Plasma doping or ion implantation enables implantation energies down to 50 eV and is suitable for implanting dopant such as boron (B), phosphorus (P), arsenic (As) and group IV elements such as silicon (Si) and germanium (Ge) using their hydrate precursors ionized in the plasma. The concentration of implanted dopants is controlled by the implanted ion dose. Modulation of the resulting metallic film chemical structure requires up to several atomic percent of dopant in the film (e.g., in enhancement layer 42). For example, for a 5 nm thick metallic film for enhancement layer 42, the implanted ion dose is from about $10^{14}$ ions/cm$^2$ to about $10^{16}$ ions/cm$^2$ to provide a doping level of about 0.3 atomic percent to about 30 atomic percent. In some embodiments, a beamline ion implantation can be used for the implantation step. Beamline implantation equipment can provide ion beams with implantation energy down to 100's of eV but allows for particular ion selection and filtering and for selecting a particular tilt angle between the substrate surface and the ion beam and can be desirable for dopant elements such as antimony (Sb).

When one of these Group IV materials (Ge, Co, Si, etc.) is implanted into enhancement layer 42, in some embodiments, the annealing process discussed in detail below may not be performed. In other embodiments, using molecular layer doping (MLD), which is a version of ALD, deposits a very thin (e.g., several atoms thick) layer of the additional material (Si, Ge, Ti, Co, etc.) onto the surface of enhancement layer 42.

In another embodiment, a different optional step is performed where the optional step is an ion implantation of doping atoms (e.g., arsenic (As), phosphorous (P), antimony (Sb)) or a deposition of the doping atoms (As, P, Sb, etc.) in or on enhancement layer 42. This optional step also occurs after depositing enhancement layer 42 (e.g., Ti, Ge, Co, Ni). The deposition of one or more of As, P, or Sb, for example, can occur using one of ALD, MLD, CVD, or PVD deposition processes as discussed above. The implantation process can be one of the implantation processes previously discussed in detail. For example, after depositing enhancement layer 42, the optional implantation process of with one or more of As, Si, Ge, P, and/or a Group IV material using an ion implantation process may occur.

Figure 5:
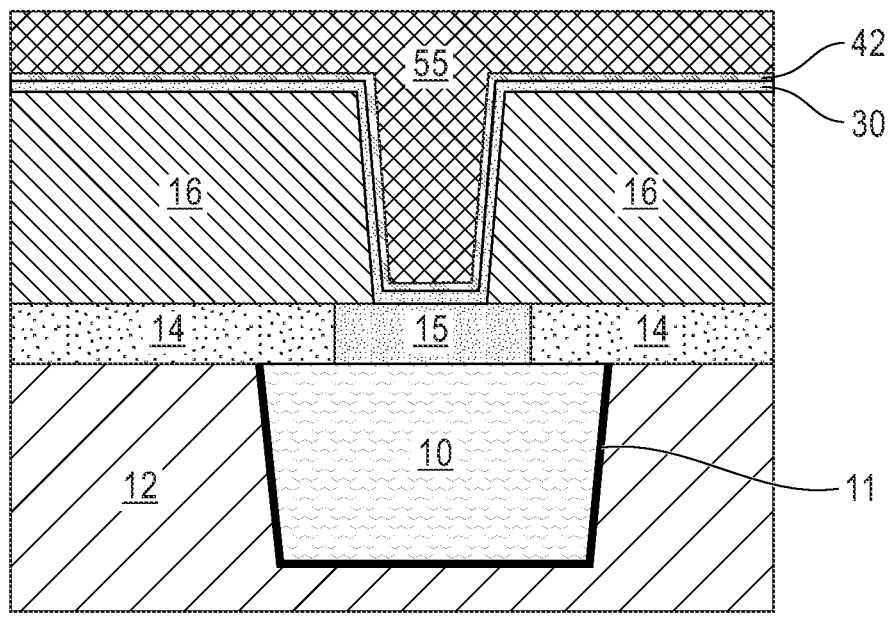
FIG. 5 is a cross-sectional view of the semiconductor structure after depositing a phase change material over the enhancement layer, in accordance with an embodiment of the present invention.

FIG. 5 is a cross-sectional view of semiconductor structure 500 after depositing GST 55 over enhancement layer 42, in accordance with an embodiment of the present invention. As depicted, FIG. 5 includes GST 55, enhancement layer 42, liner 30, ILD 16, BE 15, cap 14, Mx metal 10, contact liner 11, and ILD 12. In various embodiments, GST 55 is a phase change material with at least one group IV element from the Periodic Table of Elements used PCM devices (i.e., GST 55 is not limited to germanium-selenium-tellurium or germanium-antimony-tellurium but could refer to any suitable phase change material). In some embodiments, GST 55 is a doped phase change material (e.g., GST doped or mixed with $SiO_2$). In one embodiment, GST 55 is composed of a multilayer GST structure (not depicted in FIG. 5). For example, the multilayer phase change material can be composed of alternating layers of GST and doped GST where either of GST or the doped GST abut enhancement layer 42 (e.g., similar to the alternating layers of dGST 111 and GST 112 depicted in FIG. 12C or in FIG. 16). In various embodiments, silicon dioxide is used to dope GST.

The layer of GST 55 may be deposited with known deposition processes, such as CVD, PVD, ALD, or any other known phase change material deposition process. GST 55 can be deposited over the surface of enhancement layer 42 and fills the round hole or pore previously formed in ILD 16. GST 55 abuts enhanced layer 42. In an embodiment, the annealing process is performed after depositing the GST 55. The process discussed in detail with respect to FIG. 8 may be performed after GST 55 deposit rather than after top electrode deposition and patterning depicted later in FIG. 8.

In an embodiment, a different phase change material (i.e., not GST) is deposited over enhancement layer 42. In this embodiment, one of the same materials for enhancement layer 42 or a different material is selected to be annealed to form an appropriate metal compound reducing the interface contact resistivity between the annealed liner which also may have other materials like Si, Ge, As, P, Co, Ni, Ti etc. deposited or doping the liner prior to annealing.

Figure 6:
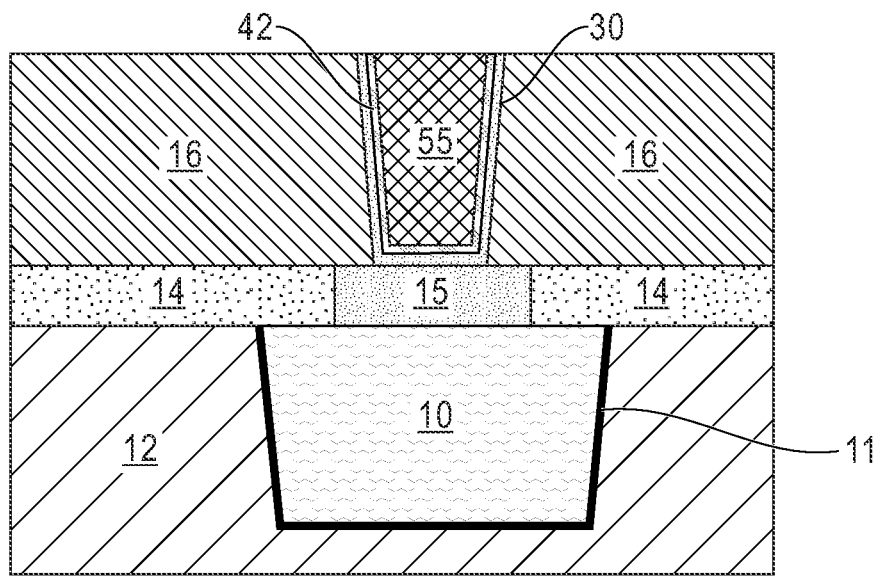
FIG. 6 is a cross-sectional view of the semiconductor structure after performing a chemical mechanical polish to remove the phase change material over the interlayer dielectric material, in accordance with an embodiment of the present invention.

FIG. 6 is a cross-sectional view of semiconductor structure 600 after performing a CMP, in accordance with an embodiment of the present invention. As depicted, FIG. 6 includes the elements of FIG. 5 but, without GST 55 over top surfaces of ILD 16. The CMP removes the top portion of GST 55 that is over ILD 16 while leaving the portion of GST 55 in the hole or via-like pore previously formed in ILD 16 (as depicted in FIG. 2).

In one embodiment, the annealing process is performed after the CMP of the top of GST 55. The process discussed in detail with respect to FIG. 8 may be performed after the CMP of GST 55 rather than after top electrode deposition and patterning.

Figure 7:
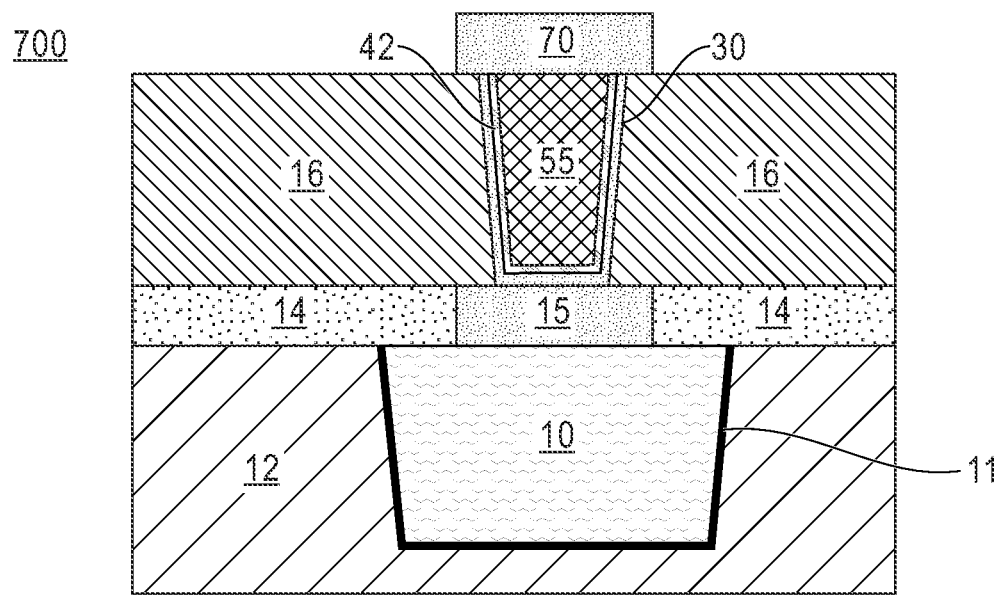
FIG. 7 is a cross-sectional view of the semiconductor structure after forming a top electrode over the phase change material, exposed surfaces of the liner and the enhancement material, in accordance with another embodiment of the present invention.

FIG. 7 is a cross-sectional view of semiconductor structure 700 after depositing and patterning top electrode 70 in accordance with another embodiment of the present invention. As depicted, FIG. 7 includes the elements of FIG. 6 and top electrode 70. Top electrode 70 can be deposited over ILD 16, GST 55, exposed surfaces of liner 30, and enhancement layer 42 which may include optional doping material layers or implanted materials using a known electrode deposition process, such as CVD, PVD, or ALD for example. Top electrode 70 may be composed of any known PCM device electrode material, such as TaN, TiN, Ru, or W but is not limited to these materials.

The deposited layer of top electrode material may be patterned, for example using lithography and a directional etch, such as RIE to form top electrode 70. The width of top electrode 70 may be greater than or be the same as the width of the top surface of GST 55 and liner 30. In various embodiments, top electrode 70 is connected to one or more BEOL metal layers above top electrode 70. For example, using known BEOL processes, a contact (not depicted) in an ILD layer (not depicted) can be formed in another ILD layer over ILD 16 and top electrode 70. The contact may connect to one or more lines in a metal layer above the Mx metal layer.

Figure 8:
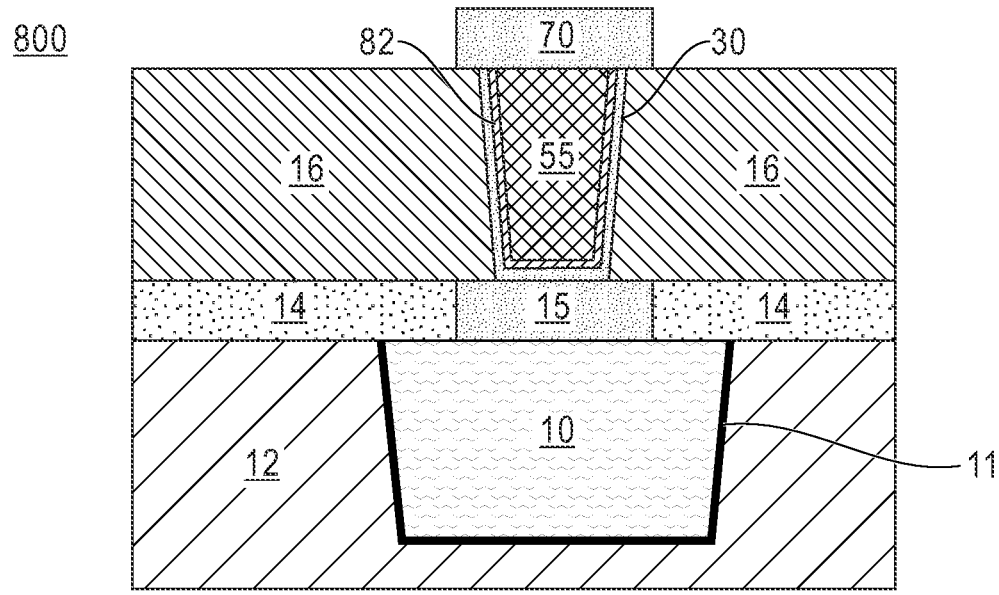
FIG. 8 is a cross-sectional view of the semiconductor structure after annealing semiconductor structure 800 to form improved liner 82, in accordance with an embodiment of the present invention.

FIG. 8 is a cross-sectional view of semiconductor structure 800 after annealing semiconductor structure 800 to form improved liner 82, in accordance with an embodiment of the present invention. As depicted, FIG. 8 includes top electrode 70, improved liner 82 over liner 30, GST 55, ILD 16, BE 15, cap 14, Mx metal 10, contact liner 11, and ILD 12. In various embodiments, the annealing process initiates an interface reaction between GST 55 and enhanced layer 42 which may include one or more optional deposited or implanted doping materials as previously discussed in detail with respect to FIG. 4 to form a new liner, such as improved liner 82. Improved liner 82 provides a lower contact resistivity with GST 55 in the crystalline phase than the contact resistivity between GST 55 in the crystalline phase and liner 30. At the same time, the improved liner 82 provides even lower contact resistivity with liner 30 than its contact resistivity with the GST.

In various embodiments, improved liner 82 is composed of a metal germanosilicide material. Improved liner 82, in these embodiments, can have a chemical composition of the form TiGeSi (e.g., composed of titanium germanium and silicon). In other embodiments, improved liner 82 is composed of a doped metal germanosilicide material. Improved liner 82, in these embodiments, can have a chemical composition of the form TiGeSi:As (e.g., composed of titanium, germanium, silicon, and arsenic). Respective amounts of silicon and germanium may vary in the improved liner 82. In some embodiments, either silicon or germanium maybe absent in the improved liner 82. In these embodiments, the improved liner 82 is composed of a metal germanide or a metal silicide, respectively. For instance, enhanced layer 42 forms a doped metal silicide, such as $TiSi_2$:As when Ti reacts with silicon and the dopants. An observed contact resistivity of the metal germanosilicide of improved liner 82 and GST 55 in the crystalline phase can range from $10^{-7}$ to $10^{-9}$ Ohm-$cm^2$ as opposed the contact resistance of liner 30 formed with typical metal alloys (i.e., TaN or TiN) for liners in a PCM device which has been observed to be above $10^{-5}$ Ohm-$cm^2$. At the same time, an observed contact resistivity of the metal germanosilicide of improved liner 82 with the liner 30 can range from $10^{-9}$ to $10^{-11}$ Ohm-$cm^2$.

Using the materials, such as Ti for enhancement layer 42 deposited over liner 30 as described in detail with reference to FIG. 4 and the annealing process described in detail below, a new liner material for improved liner 82 can provide a lower electrical contact resistance and resistivity to GST 55 in the crystalline phase than the contact resistance and resistivity between liner 30 and GST 55 in the crystalline phase. In this way, forming improved liner 82 increases the electrical performance of a PCM device using improved liner 82 in contact with or abutting the sided of GST 55 and BE 15.

In other embodiments, enhancement layer 42 is doped using a deposition process, such as ALD, MLD, PVD, etc. or implanted with one or more of Si, Ge, or another group IV material as discussed previously with respect to FIG. 4 before annealing enhancement layer 42 to form improved liner 82 which can be either a metal germanosilicide, a metal germanide, or a metal silicide.

In some embodiments, enhancement layer 42 is doped with one or more of As, P, B, Sb, etc. to provide a reduced contact resistance and resistivity between improved liner 82 and GST 55 in the crystalline phase after performing the annealing process discussed below. The contact resistance and resistivity between improved liner 82 and GST 55 in the crystalline phase is lower than the contact resistance and resistivity between a conventional liner, such as liner 30 composed of TiN or TaN and GST 55 in the crystalline phase. At the same time, the improved liner 82 provides even lower contact resistance and resistivity with the liner 30 than its contact resistivity with the GST in the crystalline phase.

In some embodiments, improved liner 82 is composed of a doped metal silicide. In these embodiments, improved liner 82 can have a chemical composition in the form $TiSi_2$:As (e.g., improved liner 82 may be composed of titanium, silicon, and arsenic). Depositing a material, such as silicon and dopants by implantation or alternative doping of enhanced layer 42 can form a doped metal silicide after annealing with a contact resistance with GST 55 in the crystalline phase that is similar to the contact resistance of the metal germanosilicide material with GST 55 discussed above.

In a preferred embodiment, the annealing process occurs after forming top electrode 70. In other embodiments, the annealing process occurs after one of GST deposit depicted in FIG. 5 or after GST CMP depicted in FIG. 6.

The annealing process may be a millisecond anneal, such as a flash or a laser anneal or a nanosecond laser anneal. The annealing process needs to provide a sufficient amount of heat or a temperature in enhanced layer 42 to initiate and complete the interface reaction in enhanced layer 42 to form improved liner 82, for example composed of a metal germanosilicide or a metal silicide. The annealing process should not exceed the thermal budget of either of the BEOL material set or the FEOL material set in a CMOS device. In other words, the annealing process forms the metal germanosilicide, the metal germanide, or the metal silicide between GST 55 and liner 30 to improve the contact resistance between GST 55 and liner 30 without exceeding either the thermal budget for either of the BEOL material set or the FEOL material set in a CMOS device.

In general, forming a metal germanosilicide, a metal germanide, or a metal silicide material may require temperatures of about 500-700 C. Using short-scale anneals, such as a millisecond anneal, or a nanosecond laser annealing process allows formation of a stable metal germanosilicide for improved liner 82 at high-temperatures without affecting transistors or the interconnect metals in the lower levels below Mx metal 10. Millisecond annealing includes flash annealing and millisecond laser annealing. Millisecond annealing duration is typically from about 100 microseconds to about 20 milliseconds. This duration is sufficient to initiate an interfacial reaction and to mix up constituent atoms in solid phase to form the metal germanosilicide film that may be up to 10 nm thick, for example. The temperature of millisecond anneals will be limited by the melting point of PCM material, which in this case is GST and the melting point is about 600 C. In some case, a nanosecond laser annealing may provide a wider range of anneal temperatures by suppressing diffusion due to the shorter temperature pulses, however, nanosecond layer annealing can form ultra-thin metal germanosilicide layer which can be as thin as several-atomic-layer thick (e.g., less than ten nm) on the boundary of molten GST and the contact metal layer. When the metal germanosilicide layer is at least 1 nm thick, improved liner 82 has a reduced contact resistivity between GST and improved liner 82 formed with a metal germanosilicide material layer. Improved liner 82 maintains a very low contact resistance and resistivity with any unreacted metal and/or liner 30 that is under improved liner 82. After the annealing process, improved liner 82 abuts GST 55 and is between GST 55 and liner 30.

After the annealing process, improved liner 82 provides a lower contact resistance and resistivity with GST 55 in the crystalline phase than liner 30 and in this way, improved liner 82 increases the electrical performance of a PCM device formed using semiconductor structure 800 using improved liner 82. In some embodiments, enhancement layer 42 reacts with GST 55 and enhancement layer 42 (e.g., a layer of one or more of the ALD deposited Ti, Co, or Ni) and/or the doping elements, such as As, P, B, Sb, Si, Ge, etc. which may be added by the optional implantation process or an optional deposition process, such as ALD to either enhancement layer 42 during the annealing process to form improved liner 82.

Figure 9:
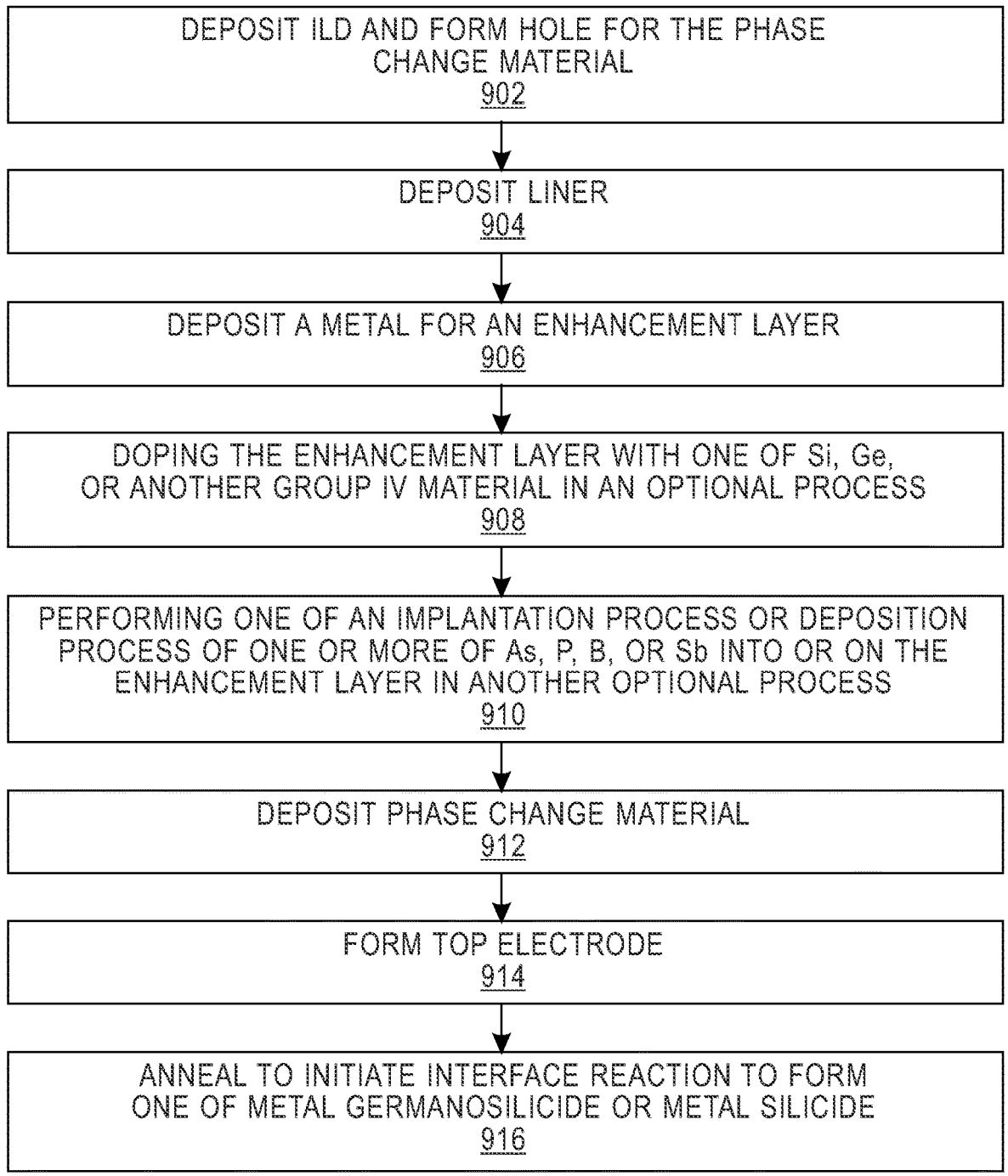
FIG. 9 is flow chart depicting one example of the processes to improve the electrical contact resistance between a phase change material in the crystalline phase and a liner in a PCM device, in accordance with a second embodiment of the present invention.

FIG. 9 is flow chart depicting one example of the processes to improve the electrical contact resistivity between a phase change material and a liner in a PCM device, in accordance with a second embodiment of the present invention. FIG. 9 depicts a method to form semiconductor structure 800 in FIG. 8 where improved liner 82 in FIG. 8 is one of a metal germanosilicide, a metal germanide, or a metal silicide. In the method depicted and discussed in detail with respect to FIGS. 1-8 and summarized in an abbreviated form in FIG. 9, steps 902, 904, 906, 912, 914, and 916 are required to form the metal germanosilicide, metal germanide, or metal silicide. Steps 908 and 910 are optional and may be performed sequentially or as an independent step (e.g., step 910 can occur without step 908).

In step 902, the method includes depositing an ILD and forming a hole for the phase change material. Using known ILD deposition processes, such as CVD, a layer of a dielectric material for an ILD layer can be deposited over a cap material with an embedded bottom electrode embedded in the cap material. The ILD may be a dielectric material such as TEOS. A sacrificial mask material and a hardmask layer can be deposited over the ILD material. The exposed top surface of the hardmask material may be patterned using lithography and etched, for example by RIE. The selective etching process (e.g., patterning and etch) creates a hole or an opening of a size suitable for creating the PCM cell. The hole is etched in the hardmask, the sacrificial mask, and the ILD material and is directly above the bottom electrode. The hole may have a depth ranging from 80 to 140 nm but is not limited to these depths. A shape of the hole may be round, oval, rectangular, or square with a diameter or a width suitable for forming a PCM device. A CMP is performed to remove the hardmask and the sacrificial mask above the ILD material.

In step 904, the method includes depositing a liner. The liner can be deposited by CVD, PCD, or ALD and may be composed of a conventional liner material used in PCM cells, such as TaN, TiN, W, or another metal liner material.

In step 906, the method includes depositing a metal layer for an enhancement material. In various embodiments, a thin layer of Ti may be deposited as an enhancement material. In some embodiments, one of Co, Ge, or Ni is deposited instead of Ti. The metal layer can be deposited using ALD as discussed in detail with respect to FIG. 4. In later steps, during an annealing process, the enhancement material has an interface reaction with the phase change material (e.g., GST) to form a thin layer of metal germanosilicide, metal germanide, or metal silicide material.

In step 908, the method includes the optional doping the enhancement material with one of Si, Ge, or another group IV material. As discussed previously with respect to FIG. 4, in some cases an optional process may occur, using ALD, MLD, or PVD, for example, an element such as Si or Ge can be deposited on the enhancement layer (i.e., Ti, Ge, Ni, or Co). In other cases, an implantation process, such as ion implantation or an ion beam implantation can dope the enhancement material with one of Si or Ge. This optional process can be performed after the deposition of the enhancement material.

In step 910, in another optional step, performing one of an implantation process or deposition process of one or more of As, P, B, or Sb may occur on the enhancement material. In some embodiments, the doping of enhancement material with As, P, B, or Sb can occur after step 908. In other embodiments, the doping of enhancement material with As, P, B, or Sb can occur after the deposition of the enhancement material in step 906 and optional step 908 does not occur. One of an ion implantation process, an ion beam implantation process, a molecular layer doping process, or deposition by ALD or PVD may occur using the processes discussed in detail with respect to FIG. 4. The optional processes discussed in steps 908 and 910 may occur independently, sequentially, or not occurs in various embodiments of the present invention.

In step 912, the method includes depositing a phase change material. In various embodiments, a layer of GST is deposited over the semiconductor structure and fills the hole formed in step 902. In some embodiments, one of a doped GST material, a multilayered GST composed of alternating layers of GST and d-GST, or another phase change material is deposited. A CMP of the phase change material removes excess GST, the liner material, and the enhancement material from the top surface of the ILD in the semiconductor structure. In some embodiments, the annealing process occurs after the phase change material deposition or after the CMP.

In step 914, the method includes forming top electrode using known electrode formation processes. For example, a layer of any known electrode materials is deposited over the semiconductor structure (e.g., over the remaining exposed surfaces of the GST, the liner, the enhancement material, and the ILD). The electrode material is patterned and etched to form the top electrode over the GST, the liner, the enhancement material, and a portion of the ILD adjacent to the liner).

In step 916, the method includes an annealing process to initiate an interface reaction to form one of metal germanosilicide or metal silicide material between the conventional liner (e.g., TaN, TiN, W, etc.) and the phase change material for an improved contact layer. The annealing process as discussed in detail with reference to FIG. 5 can include a millisecond anneal, such as a flash or a laser anneal, or a nanosecond laser anneal. The annealing process needs to provide a sufficient amount of heat or a temperature in the enhanced layer to initiate and complete the interface reaction between the enhancement material and the phase change material (e.g., GST) to form an improved contact layer that provides a better contact resistance between the phase change material in the crystalline phase and the improved contact layer that is lower than the contact resistance between the phase change material (e.g., GST) and a conventional liner composed of TaN or TiN, for example.

In various embodiments, the enhancement material (e.g., Ti) reacts with the GST to form the improved contact layer. In some embodiments, the enhancement layer with one of the optional dopants or implanted elements (e.g., doped or implanted elements in one or both of optional steps 908 or 910) reacts with the GST to form the improved contact layer (e.g., one of a metal germanosilicide, a metal germanide, or a metal silicide). When Ti reacts with GST, the enhancement material and one or more of the dopants during the annealing process, the improved contact layer can form a doped compound material, such as one of $TiGe_2$:As or $TiSi_2$:As to improve the electrical contact resistance and resistivity between the GST in the crystalline phase and the new and improved contact material that, in some embodiments, could be considered a portion of the liner material (e.g., a metal germanosilicide, a metal germanide, or a metal silicide liner).

Figure 10:
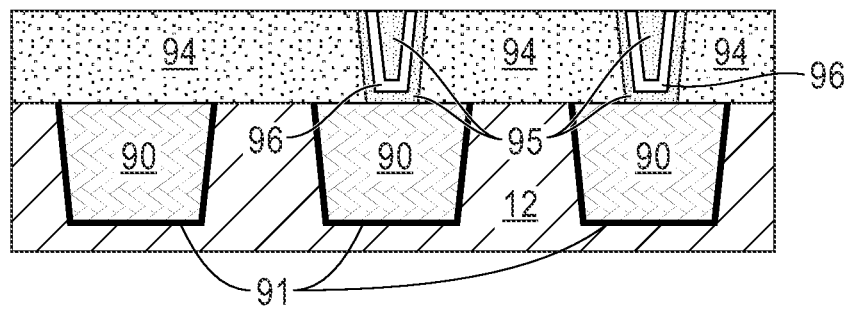
FIG. 10 is a cross-sectional view of a semiconductor structure after forming two heater elements composed of alternating layers of heater material in holes etched in a dielectric material, in accordance with a second embodiment of the present invention.

FIG. 10 is a cross-sectional view of semiconductor structure 1000 after forming two heater elements composed of alternating layers of heater material 95 and heater material 96 covered by enhancement layer 104, in accordance with a second embodiment of the present invention. As depicted, FIG. 10 includes ILD 12, Mx metal 90 with contact liner 91, cap 94, a heater element in each round hole patterned above a Mx metal 90 pads and etched in cap 94. As depicted, each of the two heater elements are formed above a portion of Mx metal 90 with a first layer of heater material 95 deposited in the hole on Mx metal 90 and in cap 94 that forms the sides or sidewalls of the hole, a layer of second heater material 96 is deposited on the first layer of heater material 95, and a second layer of heater material 95 is deposited on second heater material 96 filling the round hole or via-like hole. While FIG. 10 depicts two heater elements, in other embodiments, one or more than two heater elements are formed in the dielectric material of cap 94.

In various embodiments, Mx metal 90 is essentially the same as Mx metal 10 except two portions of Mx metal 90 are depicted as a pre-cursor to a horizontal bridge-type or planar PCM device rather than a PCM device depicted in FIG. 8. Contact liner 91 is essentially the same as contact liner 11. Cap 94 is formed with the same or a similar dielectric cap material as cap 14. The thickness of cap 94 can range from 2 nm to 20 nm but is not limited to this range.

The materials for Mx metal 90, contact liner 91, and cap 94 include one or more of the materials for Mx metal 10, contact liner 11, and cap 14 previously discussed with respect to FIG. 2. In various embodiments, heater material 95 is TaN and second heater material 96 is TiN. In other examples, heater material 95 can be any suitable heater material for a PCM device and second heater material 96 can be another suitable heater material for a PCM device. In one embodiment, the heater elements are composed of a single heater material (e.g., TiN, etc.).

Figure 11:
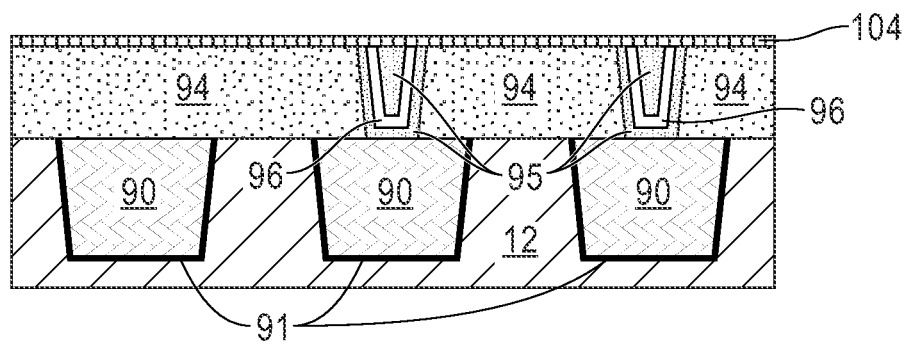
FIG. 11 is a cross-sectional view of the semiconductor structure after depositing a first layer of an enhancement material over the dielectric material and the heater elements, in accordance with a second embodiment of the present invention.

FIG. 11 is a cross-sectional view of semiconductor structure 1100 after depositing enhancement layer 104, in accordance with a second embodiment of the present invention. As depicted, FIG. 11 includes the elements of FIG. 10 and enhancement layer 104. In various embodiments, enhancement layer 104 is a layer of one of Ti, Co, Ge, or Ni. Enhancement layer 104 is a thin material layer and may be deposited with a similar deposition process as enhancement layer 42. For example, enhancement layer 104 may be deposited using one of ALD, CVD, or PVD but, is not limited to these deposition processes. The thickness of enhancement layer 104 is in the range of 1 nm to 10 nm but, is not limited to this range. The material for enhancement layer 104 can be selected for their ability to initiate an interface reaction with a phase change material, such as GST or a doped GST (dGST) material during a later annealing process, for example, to form a metal germanosilicide or a metal silicide similar to or the same as improved liner 82 depicted in FIG. 8. In one embodiment, a layer of a conventional liner material (not depicted), such as TiN, TaN, W, Ta, etc. is deposited over cap 94 and the top surface of the heater elements. After depositing the conventional liner material, enhancement layer 42 can be deposited over the conventional liner.

In a first optional deposition process or implantation process, an element from Group IV of the Periodic Table of Elements (e.g., Si, Ge, etc.) maybe implanted into enhancement layer 104 or deposited as a thin layer of an optional material, such as one of Ge, Si, etc. can be implanted into enhancement layer 104. Using one of the deposition processes, such as ALD, MLD, PVD, or an ion implantation process (e.g., a beamline ion implantation process or a plasma doping process) as previously discussed in detail with respect to FIG. 4, enhancement layer 104 is either doped with a Group IV material or has a thin layer of a Group IV material deposited on it. The first optional doping or deposition process using a Group IV material may or may not occur or may occur with or without the second optional deposition process discussed below.

In other embodiments, after depositing enhancement layer 104 or after implanting or depositing a Group IV material on enhancement layer 104, another optional deposition or implantation process may occur. In this second optional doping or deposition process, enhancement layer 104 may be implanted or doped with one of As, P, B, Sb but is not limited to these elements for the second optional doping of enhancement layer 104. In this case, enhancement layer 104 can be doped, using an implantation process, such as an ion implantation process, a molecular layer doping (MLD) process, or by depositing a thin layer of a doping material using one of ALD or PVD, for example. The deposition or implantation process uses the same or similar processes previously discussed with respect to FIG. 4. The second optional doping or deposition process may or may not occur and may occur with or without the first optional doping or deposition of a Group IV material discussed directly above.

In various embodiments, a CMP planarizes the top surface of semiconductor structure 1100 to remove excess heater material 95 and heater material 96 from the top surfaces of cap 94 to form semiconductor structure 1100.

Figure 12A:
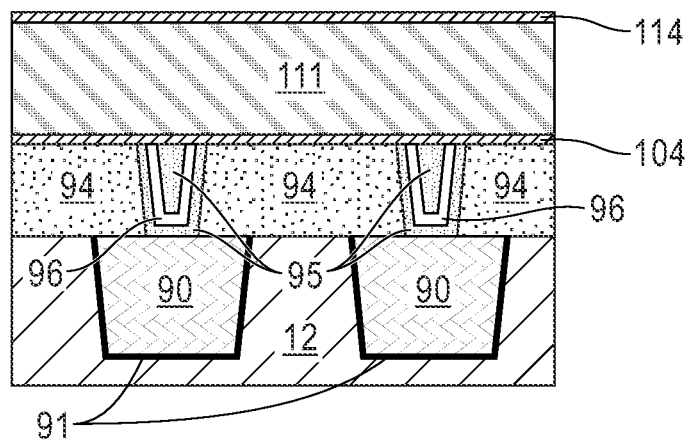
FIG. 12A is a cross-sectional view of the semiconductor structure after depositing a doped phase change material over the first layer of the enhancement material and depositing a second layer of the enhancement material, in accordance with an embodiment of the present invention.

FIG. 12A is a cross-sectional view of semiconductor structure 1200A after depositing gdST 111 over enhancement layer 104 and, then depositing enhancement layer 114 over dGST 111, in accordance with an embodiment of the present invention. As depicted, FIG. 12A includes the elements of FIG. 11 with enhancement layer 114 on dGST 111. dGST 111 may be a GST material that is doped with one of Si, Ge, SiN, $SiO_2$, GeN, GeO, or any oxide or nitride combined with a Group IV material.

A layer of a doped phase change material (i.e., dGST, or another phase change material) is deposited using one of PVD, CVD, or another similar deposition process. As depicted, dGST 111 is deposited over enhancement layer 104. In one embodiment, a conventional liner material is deposited over cap 94 and the two heater elements. In this example, enhancement layer 104 is deposited over the conventional liner material (not depicted in FIG. 12A).

In various embodiments, enhancement layer 114 deposited over dGST 111 composed of one of Ti, Ni, Ge, or Co. Enhancement layer 114 may be deposited with a similar deposition process as enhancement layer 104. For example, enhancement layer 114 may be deposited using one of ALD, CVD, or PVD but, is not limited to these deposition processes. In some embodiments, the material for enhancement layer 114 is essentially the same as the material of enhancement layer 104. The material for enhancement layer 114 can be selected for an ability to initiate an interface reaction with GST during a later annealing process, for example, to form a metal germanosilicide, a metal germanide, or a metal silicide material in later processes. The material selected and deposited for enhancement layer 114 can react with dGST during a subsequent annealing process to create a new liner material that is similar to or the same as improved liner 82 depicted in FIG. 8. In one embodiment, a layer of a conventional liner material is deposited on enhancement layer 114 after any optional processes.

In a first optional deposition or implantation process occurring after depositing enhancement layer 114, a thin layer of an optional material, such as one of Ge, Si, or another Group IV material from the Periodic Table of Elements can be implanted or deposited on enhancement layer 114 using ALD, MLD or PVD, for example. The first optional deposition or implantation process into or on enhancement layer 114 can be similar to or the same as the first optional deposition or implantation process with enhancement layer 104 discussed above with reference to FIG. 10. The first optional process of depositing or implanting a Group IV material into or on enhancement layer 114 may occur with or without the second optional process discussed below.

In other embodiments, after depositing enhancement layer 114, second optional deposition or implantation process occurs. In this second optional deposition or implantation process, enhancement layer 114 may be implanted or doped with one of As, P, B, Sb but is not limited to these elements for the second optional deposition or implantation of enhancement layer 114. In this case, enhancement layer 114 can be doped, using an implantation process, such as an ion implantation process, as ion beam implantation process, a molecular layer doping (MLD) process, or by depositing a thin layer of a doping material using one of ALD or PVD, for example. The deposition or implantation process uses the same or similar processes previously discussed with respect to FIG. 4. The second optional doping or deposition process may or may not occur and may occur with or without the first optional doping or deposition of a Group IV material discussed directly above. In one embodiment, the annealing process occurs after depositing enhancement layer 114 and after performing any of the optional processes. The annealing process is discussed previously in detail with respect to FIG. 8.

Figure 12B:
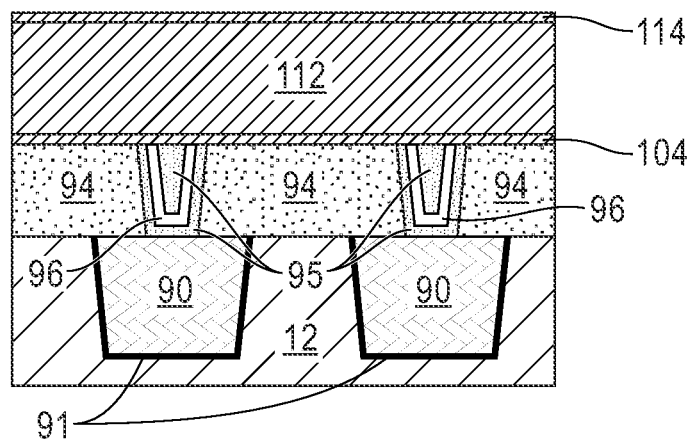
FIG. 12B is a cross-sectional view of the semiconductor structure after depositing an undoped phase change material over the first layer of the enhancement material and depositing a second layer of the enhancement material, in accordance with an embodiment of the present invention.

FIG. 12B is a cross-sectional view of semiconductor structure 1200B after depositing GST 112 and second enhanced layer 114, in accordance with an embodiment of the present invention. As depicted, FIG. 12B includes the elements of FIG. 12A except that GST 112 is deposited instead of dGST 111. In FIG. 12B, enhancement layer 104 (e.g., with or without one of more of the optional steps discussed above with respect to FIG. 12A) can be deposited over exposed top surfaces of heater material 95, second heater material 96, and cap 94 using one of PVD, CVD, or another similar deposition process). A layer of GST 112 that is a pure phase change material (i.e., a pure GST or other undoped phase change material) is deposited over enhancement layer 104.

In various embodiments, enhancement layer 114 (e.g., with or without one of more of the optional steps discussed above with respect to FIG. 12A) can be deposited over exposed top surface of GST 112. In various embodiments, enhancement layer 114 is composed of Ti, Ge, Co. or Ni. The first and/or the second optional deposition or implantation process of a Group IV material and/or As, P, B, Sb, material can occur on or into GST 112 using the same or similar processes discussed above with respect to FIG. 12A before depositing enhancement layer 114 on GST 112.

In one embodiment, a conventional liner material is deposited over enhancement layer 104 and under enhancement layer 114 after depositing enhancement layer 104 and before depositing enhancement layer 114 using one of PVD, CVD, or another similar deposition process. In one embodiment, the annealing process occurs after depositing enhancement layer 114 and after performing any of the optional processes. The annealing process is discussed previously in detail with respect to FIG. 8.

Figure 12C:
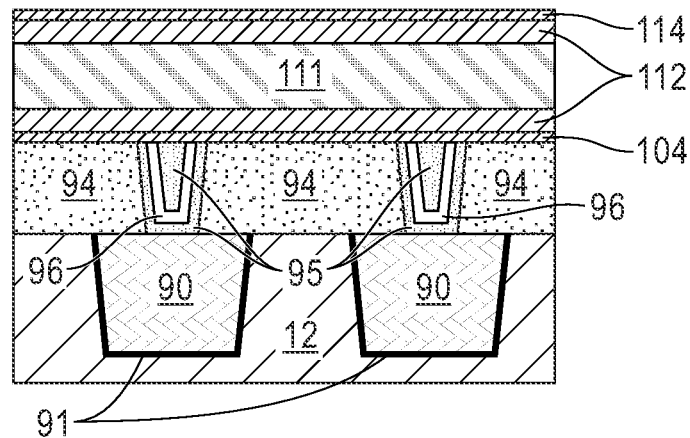
FIG. 12C is a cross-sectional view of the semiconductor structure after depositing two layers of the undoped phase change material on the dielectric material and heater elements with a layer of the doped phase change material between the two layers of the undoped phase change material, in accordance with an embodiment of the present invention.

FIG. 12C is a cross-sectional view of semiconductor structure 1200C after depositing a multilayered phase change material and second enhanced layer 114, in accordance with an embodiment of the present invention. The multilayered phase change material is depicted in FIG. 12C with the first layer of GST 112 on enhancement layer 104 with a layer of dGST 111 on the first layer of GST 112 and another layer of GST 112 on dGST 111. In other examples, the multilayered phase change material may be composed of any number of layers of different or doped and undoped phase change materials (e.g., three layers of GST 112 and two layers of dGST 111). As depicted, FIG. 12C includes the elements of FIG. 11A except that a multilayer phase change material replaces dGST 111.

In FIG. 12C, the multilayered phase change material structure (e.g., GST 112/dGST 111/GST 112) is deposited on enhancement layer 104 before depositing one of Ti, Co, or Ni as enhancement layer 114. As discussed above with reference to FIGS. 12A and 12B, after depositing enhancement layer 114 on the top layer (i.e., GST 112) of the multilayered GST structure depicted in FIG. 12C, one or both of the first and/or the second optional deposition or implantation of a Group IV material (e.g., Si, Ge, etc.) or one of As, P, B, or Sb may occur on or into enhancement layer 114. In one embodiment, the annealing process occurs after depositing enhancement layer 114 and after performing any of the optional processes. The annealing process is discussed previously in detail with respect to FIG. 8.

Figure 13:
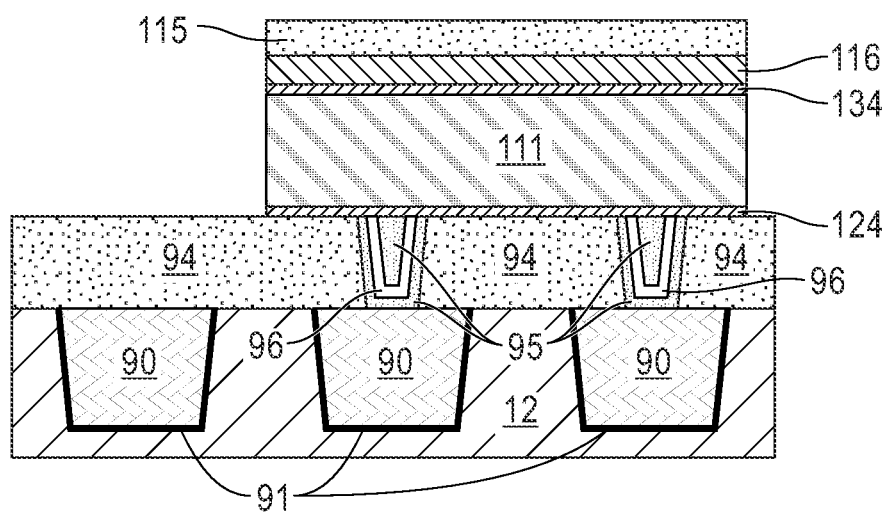
FIG. 13 is a cross-sectional view of the semiconductor structure after depositing a top electrode and a cap material over the second enhancement material above the doped phase change material and then, selectively etching the layers of the PCM device, in accordance with an embodiment of the present invention.

FIG. 13 is a cross-sectional view of semiconductor structure 1300 after depositing top electrode 216 over enhancement layer 114 and cap 115 over top electrode 216, and then, performing an annealing process, in accordance with an embodiment of the present invention. As depicted, FIG. 13 includes Mx metal 90, liner 91, cap 94, two heater elements composed of heater material 95 and 96, improved liner 124, dGST 111, improved liner 134, top electrode 134, and cap 115 after depositing top electrode 216 and cap 115 and after performing an anneal process transforming enhancement layer 104 (not depicted in FIG. 12A) into improved liner 124 and enhancement layer 114 into improved liner 134. Improved liner 124 and improved liner 134, like improved liner 82 depicted in FIG. 8, can be composed of one of a metal germanosilicide or a metal silicide material.

In various embodiments, a layer of a top electrode material, such as but not limited to TiN TaN, Ru, or W is deposited on enhancement layer 114 (not depicted in FIG. 12A) for top electrode 216 followed by a layer of a cap material, such as SiN for cap 115 on top electrode 216. Known deposition processes, such as CVD or PVD can deposit cap 115 on top electrode 216 and top electrode 216 on enhancement layer 114.

In various embodiments, after depositing top electrode 216 and cap 115, the annealing process occurs. The annealing process, which is similar to or the same as the annealing process discussed in detail with respect to FIG. 8, can occur transform enhancement layer 104 (not depicted in FIG. 12A) and enhancement layer 114 (not depicted in FIG. 12A) into improved liner 124 and improved liner 134, respectively.

The annealing process can be one of the annealing processes previously discussed in detail with respect to FIG. 8. For example, the annealing process may be a millisecond anneal, such as a flash or a laser anneal, or a nanosecond laser anneal. The annealing process needs to provide a sufficient amount of heat or a temperature in enhanced layer 104 and enhanced layer 114 to initiate and complete the interface reaction in enhanced layers 104 and in second enhanced layer 114 to form improved liner 124 and improved liner layer 134, respectively, that are composed of one of a metal germanosilicide, a metal germanide, or a metal silicide material. Similar to the annealing processes used to form semiconductor structure 800 in FIG. 8, the annealing process should not exceed the thermal budget of either the BEOL material set or the FEOL material set in a CMOS device. Improved liners 124 and 134 provide a lower contact resistance and resistivity with GST 111 in the crystalline phase than the contact resistance and resistivity between GST 111 in the crystalline phase and a conventional liner composed of TiN.

The top surface of cap 115 can be patterned after the annealing process and portions of cap 115, top electrode 216, improved liner 134, dGST 111, and improved liner 124 are removed, for example using a dry etch process (e.g., RIE) or a wet etch process. In one embodiment, the portions of cap 115, top electrode 216, enhancement layer 114, dGST 111, and enhancement layer 104 are removed before the annealing process.

In some embodiments, the deposition of top electrode 216 over enhancement layer 114 and cap 115 over top electrode 216 occurs when enhancement layer 114 is on GST 112 instead of dGST 111. In these embodiments, top electrode 216 is deposited over semiconductor structure 1200B depicted in FIG. 12B. The annealing process and the selective etch of the layers of top electrode 116, cap 115, improved liner 134, GST 112, and improved liner 124 can occur as discussed above with respect to semiconductor structure 1300.

After performing the selective etching processes, semiconductor structure 1300 forms a planar PCM device with improved liner 134 above and improved liner 124 below dGST 111.

Figure 14:
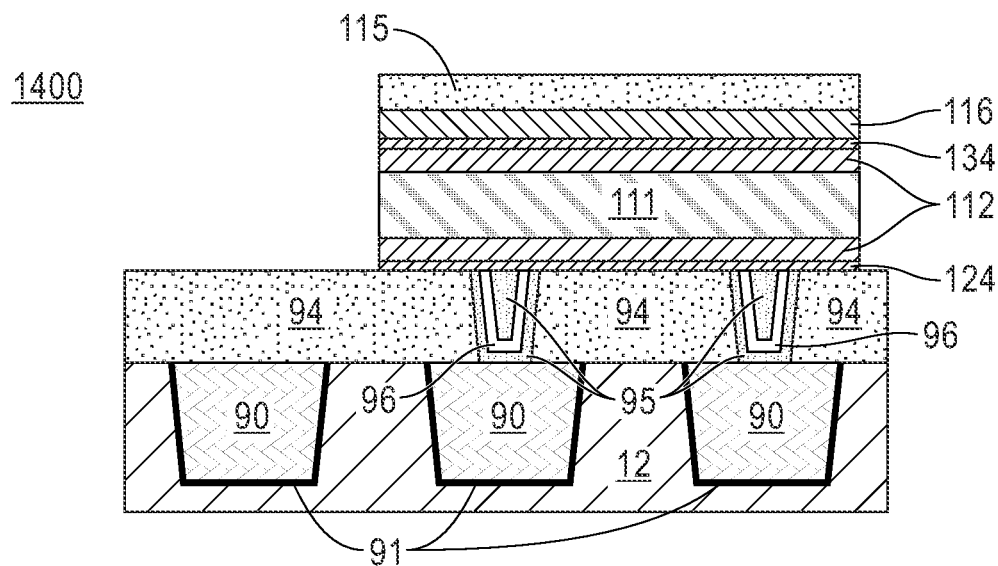
FIG. 14 is a cross-sectional view of the semiconductor structure after depositing a top electrode and a cap material over the second enhancement material above the undoped phase change material and then, selectively etching the layers of the PCM device, in accordance with an embodiment of the present invention.

FIG. 14 is a cross-sectional view of semiconductor structure 1400 after depositing top electrode 216 over enhancement layer 114 and cap 115 over top electrode 216 and then, performing an annealing process, in accordance with an embodiment of the present invention. As depicted, FIG. 14 includes the elements of FIG. 12C except that enhancement layer 104 and enhancement layer 114 are not depicted in FIG. 14 because enhancement layer 104 and 114 are transformed during the annealing process to improved liner 124 and improved liner 134. Top electrode 215 and cap 115 are also depicted in FIG. 14.

Similar to the process of forming semiconductor structure 1300, in various embodiments, a layer of a top electrode material, such as TiN is deposited on enhancement layer 114 (not depicted in FIG. 14) followed by a layer of a cap material, such as SiN for cap 115 on top electrode 216. Known deposition processes, such as CVD or PVD cap 115 can be deposited on top electrode 216 and top electrode 216 deposited on enhancement layer 114.

In various embodiments, after depositing top electrode 216 and cap 115, the annealing process occurs. The annealing process, which is similar to or the same as the annealing process discussed in detail with respect to FIG. 8 and FIG. 13, can occur transforming enhancement layer 104 (not depicted in FIG. 14) and enhancement layer 114 (not depicted in FIG. 14) into improved liner 124 and improved liner 134, respectively. Improved liners 124 and 134 provide a lower contact resistivity with GST 112 in the crystalline phase than the contact resistivity between GST 112 in the crystalline phase and a conventional liner composed of TiN. At the same time, the improved liner 82 provides even lower contact resistance and resistivity with adjacent electrodes 116 and 95. As depicted, GST 112 is in the outer layer of two-phase change materials composing the multilayer phase change material structure. In other embodiments, dGST 111 is the outer layer of the multilayer phase change material structure.

The top surface of cap 115 can be patterned after the annealing process and portions of cap 115, top electrode 216, improved liner 134, dGST 111, and improved liner 124 are removed, for example using a dry etch process (e.g., ME) or a wet etch process. In one embodiment, the portions of cap 115, top electrode 216, enhancement layer 114, dGST 111, and enhancement layer 104 are removed before the annealing process.

After performing the selective etching processes, semiconductor structure 1400 forms a planar PCM device with improved liner 134 above and improved liner 124 below GST 112 in a multiple layer phase change material structure.

Figure 15:
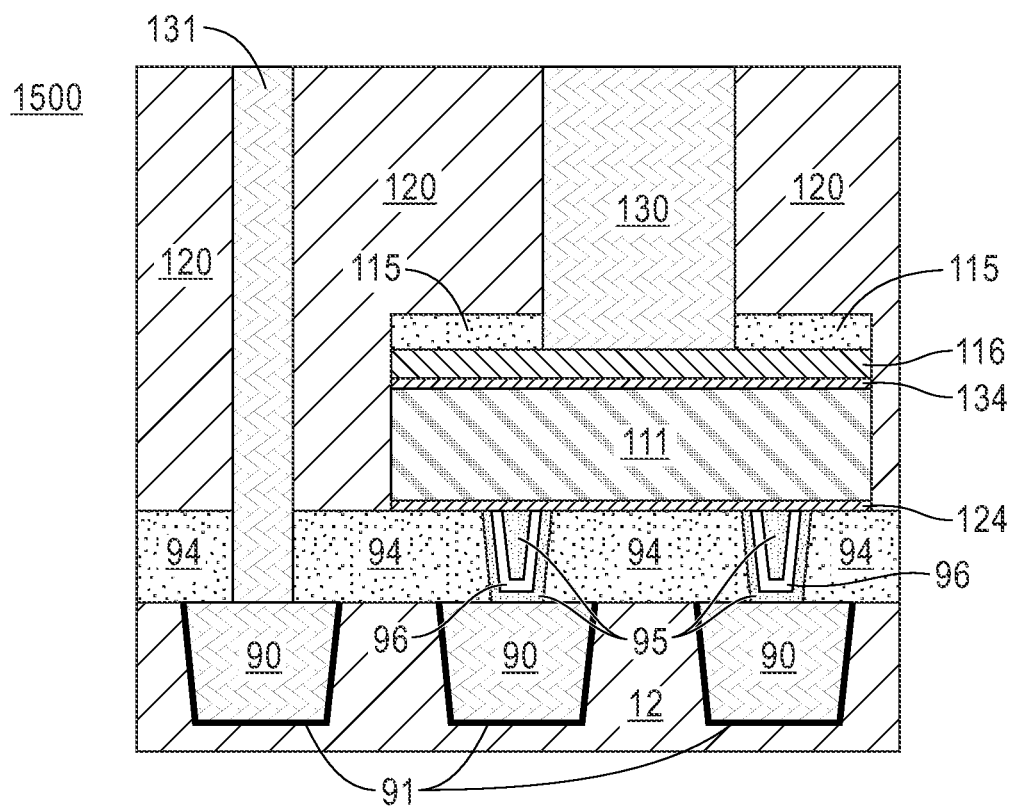
FIG. 15 is a cross-sectional view of the semiconductor structure after depositing an ILD material on the semiconductor structure depicted in FIG. 13, and forming a top contact and a bottom contact, in accordance with an embodiment of the present invention.

FIG. 15 is a cross-sectional view of semiconductor structure 1500 after depositing ILD 120 and forming top contact 130 and contact 131 on semiconductor structure 1300, in accordance with an embodiment of the present invention. As depicted, FIG. 15 includes the elements of FIG. 13 and ILD 120, top contact 130 on top electrode 216, and contact 131 on a portion of Mx metal 90 that is adjacent to one of the portions of Mx metal 90 under a heater element. In some embodiments, contact 131 is bottom contact to the planar PCM device depicted in FIG. 13. In other embodiments, contact 131 is a contact to one or more logic devices contacting or under the portion of Mx metal 90 under contact 131. In various embodiments, top contact 130 and contact 131 are connected to one or more metal lines (e.g., Mx+1 metal lines or Mx metal lines) that are not depicted in FIG. 15.

Using known damascene BEOL processes, ILD 120 can be deposited over exposed surfaces of cap 115, top electrode 216, improved liner 134, dGST 111, improved liner 124, and cap 94, enhanced layer 104 (not depicted in FIG. 13). After a patterning cap 115, an etch process removes portions of ILD 120, cap 115, and top electrode 216, a BEOL metal layer (e.g., Cu, W, Co, Ru. etc.) can be deposited. The deposited BEOL metal layer can be the Mx+1 metal layer. A CMP removes excess BEOL metal over ILD 120 to form top contacts 130 and contact 131. In another embodiment, the damascene processes for BEOL contact formation are performed on a semiconductor structure with GST 112 replacing dGST 111.

Figure 16:
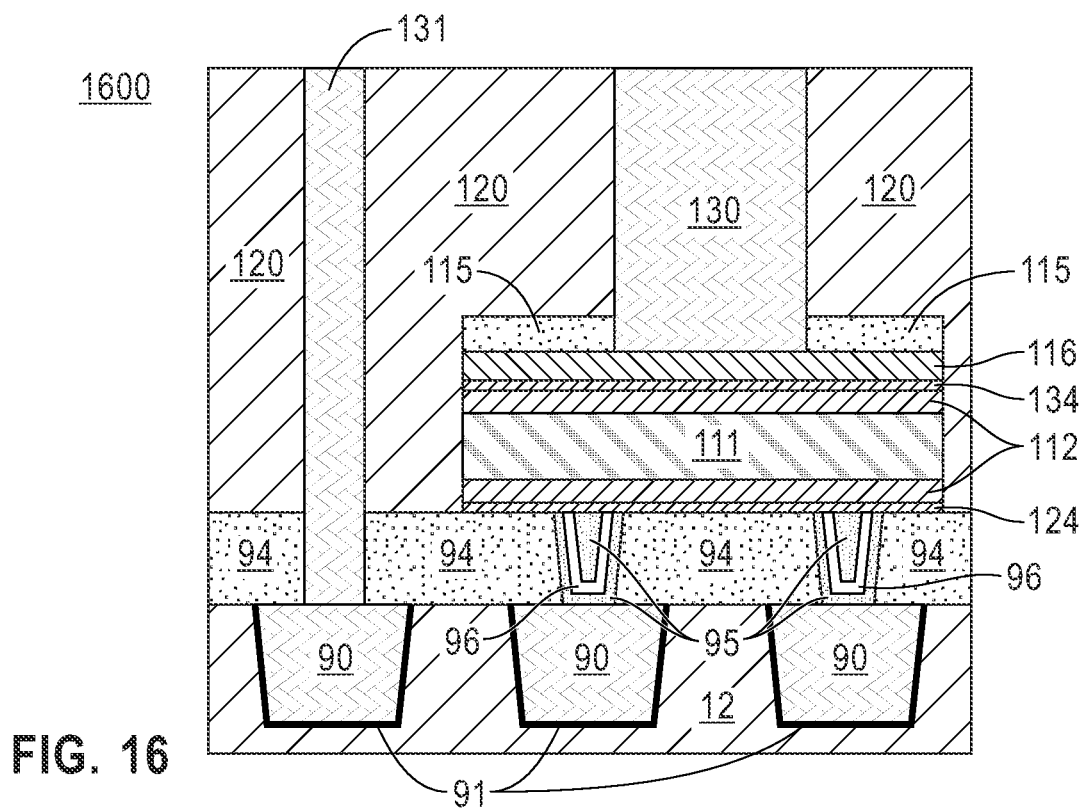
FIG. 16 is a cross-sectional view of the semiconductor structure after depositing an ILD material on the semiconductor structure depicted in FIG. 14, and forming a top contact and a bottom contact, in accordance with an embodiment of the present invention.

FIG. 16 is a cross-sectional view of semiconductor structure 1600 after depositing ILD 120 on semiconductor structure 1400, and forming top contact 130 and contact 131, in accordance with an embodiment of the present invention. As depicted, FIG. 16 includes the elements of FIG. 14 and with ILD 120, top contact 130, and contact 131. Semiconductor structure 1600 is essentially the same as semiconductor structure 1500 except for the addition of extra two layers of GST 112 surrounding the multilayered phase change material structure. Semiconductor structure 1600 can be formed with known damascene BEOL contact formation processes (e.g., ILD 120 deposition, selective etch, Mx+1 metal layer deposition, and CMP). The Mx+1 metal layer can be a metal layer directly above Mx metal 90. Contact 131 can be a bottom electrode contact to the planar PCM device. In other embodiments, contact 131 is a contact to one or more logic devices contacting or under the portion of Mx metal 90 under contact 131. In various embodiments, top contact 130 and contact 131 are connected to one or more metal lines (e.g., Mx+1 metal lines or Mx metal lines) that are not depicted in FIG. 15.

Figure 17:
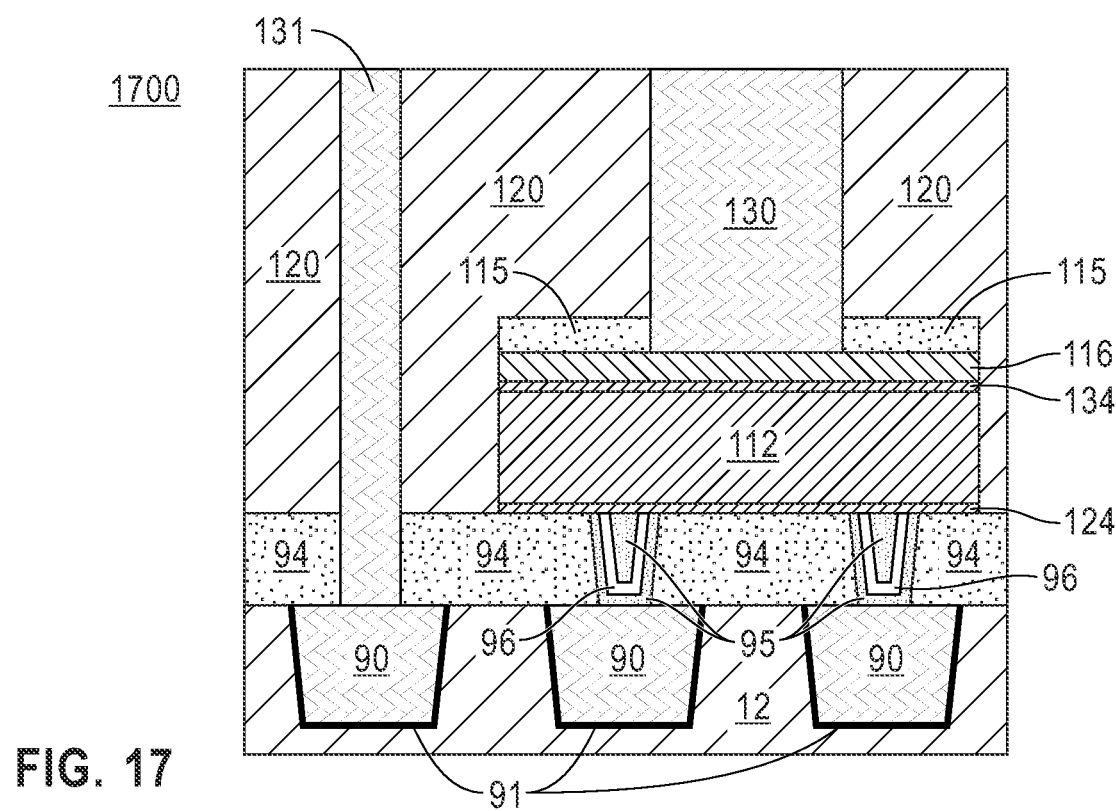
FIG. 17 is a cross-sectional view of the semiconductor structure after depositing an ILD material on a semiconductor structure formed with an undoped phase change material, and forming a top contact and a bottom contact, in accordance with an embodiment of the present invention.

FIG. 17 is a cross-sectional view of semiconductor structure 1700 after depositing ILD 120 and forming top contact 130 and contact 131, in accordance with an embodiment of the present invention. As depicted, FIG. 17 is essentially the same as FIG. 15 except that dGST 111 is replaced with GST 112. Semiconductor structure 1700 can be formed with known damascene BEOL processes as previously discussed (e.g., IL D 120 deposition, ILD patterning, selective etch, Mx+1 metal layer deposition, and CMP).

Figure 18:
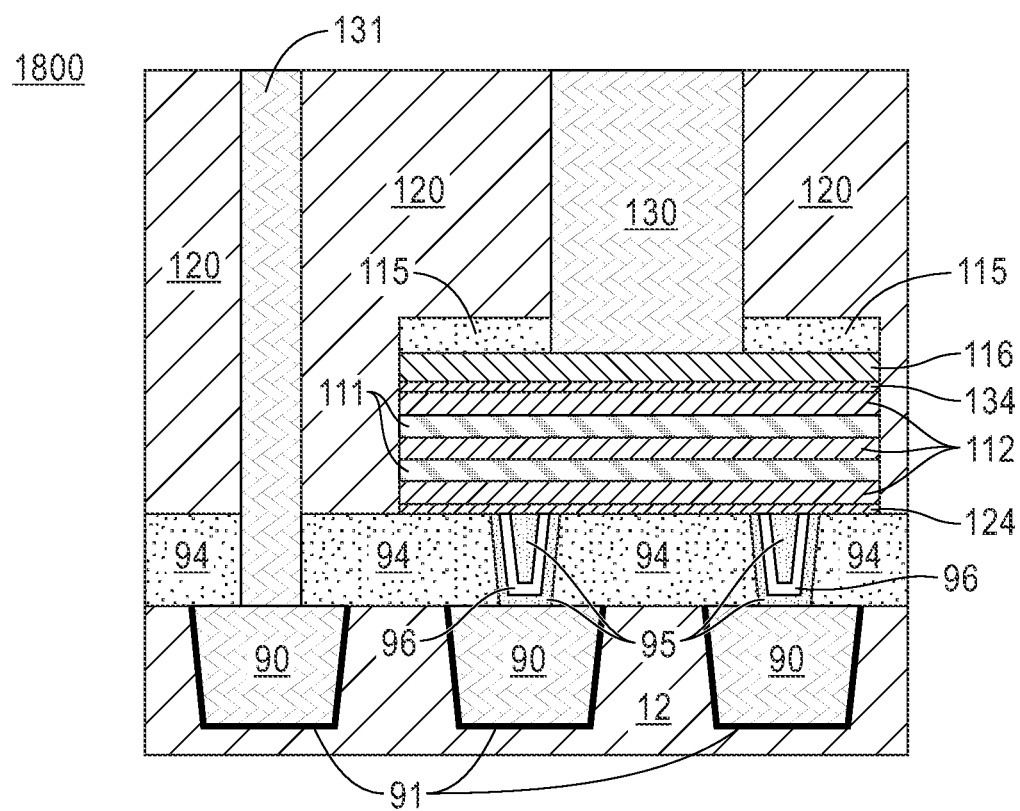
FIG. 18 is a cross-sectional view of the semiconductor structure after depositing an ILD material on a semiconductor structure with multiple layers of the phase change material, and forming a top contact and a bottom contact, in accordance with an embodiment of the present invention.

FIG. 18 is a cross-sectional view of semiconductor structure 1800 after depositing ILD 120 and forming top contact 130 and contact 131, in accordance with an embodiment of the present invention. As depicted, FIG. 18 is essentially the same as FIG. 16 except that additional layers of dGST 111 and GST 112 are added to the multilayer phase change material structure in FIG. 18.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The methods as described herein can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package. In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A phase change memory cell comprising:
   a first liner material in a dielectric material contacts a bottom electrode and a top electrode, wherein the first liner material is between the dielectric material and a second liner material; and
   the second liner material is on the first liner material between the first liner material and a phase change material, wherein the second liner material has a lower electrical contact resistivity with the phase change material than the first liner material.

2. The phase change memory cell of claim 1, wherein the second liner material with the lower electrical contact resistivity with the phase change material is composed of a material selected from the group consisting of a metal germanosilicide material, a metal germanide material, and a metal silicide material.

3. The phase change memory cell of claim 2, wherein the second liner material with the lower electrical contact resistivity with the phase change material provides an electrical contact resistivity between the second liner material and the phase change material in a crystalline phase that is lower than the electrical contact resistivity between the first liner material and the phase change material in the crystalline phase.

4. The phase change memory cell of claim 1, wherein the first liner material is composed of a material selected from the group consisting of titanium nitride, tantalum nitride, silicon, germanium, amorphous carbon, tantalum, titanium, and a metal nitride.

5. The phase change memory cell of claim 1, wherein the phase change material fills a hole in the dielectric material, and wherein a bottom of the hole that is on the bottom electrode and sidewalls of the hole are surrounded by the first liner material that is between the second dielectric material and the dielectric material.

6. The phase change memory cell of claim 1, wherein the phase change material is selected from the group consisting of a doped phase change material and a multilayer phase change material with one of more layers of the phase change material and the doped phase change material.

7. The phase change memory cell of claim 1, further comprising:
a top electrode over a top surface of the phase change material, the second liner material, the first liner material, and a portion of the dielectric material adjacent to the first liner material.

8. A phase change memory cell comprising:
one or more heater elements in a first dielectric material that each are on a portion of a metal layer in a semiconductor structure;
a first layer of an improved liner material over the one or more heater elements in the first dielectric material and over one or more portions of the dielectric material adjacent to the one or more heater elements;
a phase change material over the first layer of the improved liner material;
a second layer of the improved liner material over the phase change material; and
a top electrode over the second layer of the improved liner forming a phase change memory device.

9. The phase change memory cell of claim 8, further comprising:
a dielectric material over the top electrode;
a first contact on a portion of the top electrode; and
a second contact on another portion of the metal layer adjacent to the portion of the metal layer under each of the one or more heater elements, wherein the second contact resides in a cap dielectric and in the first dielectric material.

10. The phase change memory cell of claim 8, wherein the first layer of an improved liner material and the second layer of the improved liner material are each composed of a material selected from the group consisting of metal germanosilicide material, a metal germanide material, and a metal silicide material.

11. The phase change memory cell of claim 8, wherein the first layer of an improved liner material and the second layer of the improved liner material have a lower contact resistivity with the phase change material in a crystalline phase than a conventional phase change memory cell liner composed of a material selected from the group consisting of titanium nitride, tantalum nitride, silicon, germanium, amorphous carbon, tantalum, titanium, and a metal nitride.

12. The phase change memory cell of claim 8, wherein the phase change material is an undoped phase change material composed of germanium, selenium, and tellurium.

13. The phase change memory cell of claim 8, wherein the phase change material is between the first layer of an improved liner material on the one or more heater elements and the second layer of the improved liner material under the top electrode, and wherein a bottom electrode is over a portion of a first metal layer and the top electrode is under a contact to a second metal layer above the first metal layer.

14. The phase change memory cell of claim 8, wherein the one or more heater elements are composed of alternating layers of titanium nitride and tantalum nitride.

15. A phase change memory cell comprising:
one or more heater elements in a first dielectric material that each are on a portion of a metal layer in a semiconductor structure;
a first layer of an improved liner material over the one or more heater elements in the first dielectric material and over one or more portions of the dielectric material adjacent to the one or more heater elements;
a first phase change material over the first layer of the improved liner material;
a second phase change material over the first phase change material, wherein the second phase change material is doped;
a third phase change material over the second phase change material;
a second layer of the improved liner material over the third phase change material; and
a top electrode contacting a top electrode over the second layer of the improved liner forming a phase change memory device.

16. The phase change memory cell of claim 15, wherein the first phase change material and the third phase change material are undoped.

17. The phase change memory cell of claim 15, wherein the first layer of an improved liner material and the second layer of the improved liner material are each a doped liner material when the phase change material is composed of germanium, selenium, and tellurium.

18. The phase change memory cell of claim 15, wherein the improved liner material with a lower electrical contact resistivity with the first phase change material and the third phase change material provides an electrical contact resistivity between the improved liner material and the first phase change material and the third phase change material in a crystalline phase that is lower than the electrical contact resistivity between the first phase change material and the third phase change material in the crystalline phase than a conventional phase change memory cell liner composed of a material selected from the group consisting of titanium nitride, tantalum nitride, silicon, germanium, amorphous carbon, tantalum, titanium, and a metal nitride.

* * * * *